United States Patent
Matsuzaki et al.

(10) Patent No.: US 9,899,424 B2
(45) Date of Patent: Feb. 20, 2018

(54) SEMICONDUCTOR DEVICE AND ELECTRONIC DEVICE

(71) Applicant: Semiconductor Energy Laboratory Co., Ltd., Atsugi-shi, Kanagawa-ken (JP)

(72) Inventors: Takanori Matsuzaki, Isehara (JP); Tatsuya Onuki, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/606,465

(22) Filed: May 26, 2017

(65) Prior Publication Data

US 2017/0330901 A1    Nov. 16, 2017

Related U.S. Application Data

(63) Continuation of application No. 15/232,143, filed on Aug. 9, 2016, now Pat. No. 9,666,606.

(30) Foreign Application Priority Data

Aug. 21, 2015  (JP) ................................. 2015-163532

(51) Int. Cl.
    *H01L 29/10*   (2006.01)
    *H01L 29/12*   (2006.01)
    (Continued)

(52) U.S. Cl.
    CPC ........ *H01L 27/1225* (2013.01); *H01L 27/124* (2013.01); *H01L 27/1251* (2013.01); *H01L 27/1255* (2013.01); *H01L 29/7869* (2013.01)

(58) Field of Classification Search
    None
    See application file for complete search history.

(56) References Cited

U.S. PATENT DOCUMENTS 5,731,856 A   3/1998  Kim et al.
5,744,864 A   4/1998  Cillessen et al.
             (Continued)

FOREIGN PATENT DOCUMENTS

EP   1737044 A   12/2006
EP   2226847 A   9/2010
            (Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Charles Garber
*Assistant Examiner* — Abdulfattah Mustapha
(74) *Attorney, Agent, or Firm* — Robinson Intellectual Property Law Office; Eric J. Robinson

(57) ABSTRACT

Decrease of the output voltage of the logic circuit is inhibited by raising the gate voltage using a capacitor. In a first transistor, a drain and a gate are electrically connected to a first wiring, and a source is electrically connected to a first node. In a second transistor, a drain is electrically connected to the first node, a source is electrically connected to a second wiring, and a gate is electrically connected to a second node. In a third transistor, a drain is electrically connected to a third wiring, and a source is electrically connected to a third node, and a gate is electrically connected to the first node. In a fourth transistor, a drain is electrically connected to the third node, a source is electrically connected to a fourth wiring, and a gate is electrically connected to the second node. In a capacitor, one electrode is electrically connected to the first node, and the other (Continued)

electrode is electrically connected to the third node. OS transistors are preferably used as the transistors above.

19 Claims, 23 Drawing Sheets

(51) Int. Cl.
  *H01L 27/12* (2006.01)
  *H01L 29/786* (2006.01)

(56) References Cited

U.S. PATENT DOCUMENTS

| | | | |
|---|---|---|---|
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 8,547,771 | B2 | 10/2013 | Koyama |
| 8,988,152 | B2 | 3/2015 | Ohmaru et al. |
| 9,083,335 | B2 | 7/2015 | Koyama |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2012/0223930 | A1* | 9/2012 | Yamamoto ............... G09G 3/00 345/211 |
| 2013/0181214 | A1 | 7/2013 | Yamazaki et al. |
| 2013/0221344 | A1* | 8/2013 | Ohmaru ............. H01L 27/1225 257/43 |
| 2014/0002426 | A1* | 1/2014 | Tanada ..................... H03K 3/01 345/204 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2012-257187 A | 12/2012 |
| JP | 2013-182996 A | 9/2013 |
| WO | WO-2004/114391 | 12/2004 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Trans-

(56) References Cited

OTHER PUBLICATIONS actions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters ) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters ) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics ) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics ) , 2006, vol. 45, No. 5B, pp. 4303-4308.

(56) References Cited

OTHER PUBLICATIONS

Nomura.K et al., "Carrier transport in transparent oxide semiconductor with intrinsic structural randomness probed using single-crystalline InGaO3(ZnO)5 films", Appl. Phys. Lett. (Applied Physics Letters ), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters ), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters ) , Jun. 26, 2007, vol. 90, No. 26, pp. 262106-1-262106-3.
Park.S et al., "Challenge to Future Displays: Transparent AM-OLED Driven by PEALD Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters ), Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters ) , Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

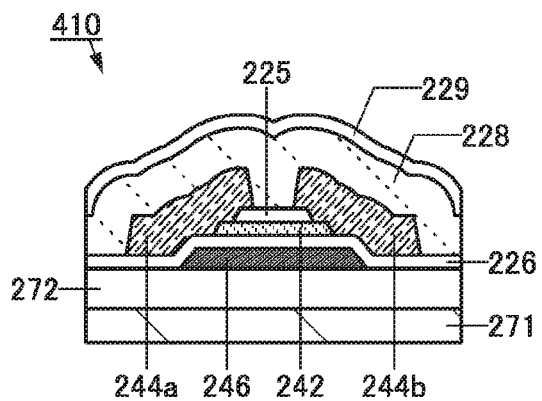
FIG. 10A1
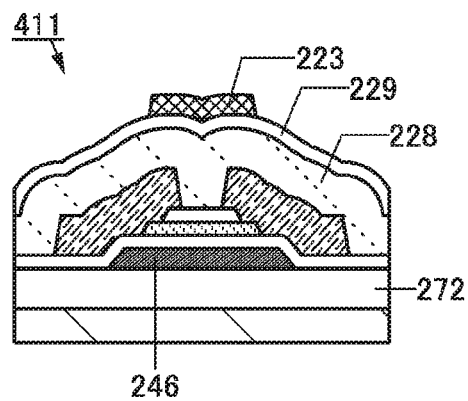
FIG. 10A2
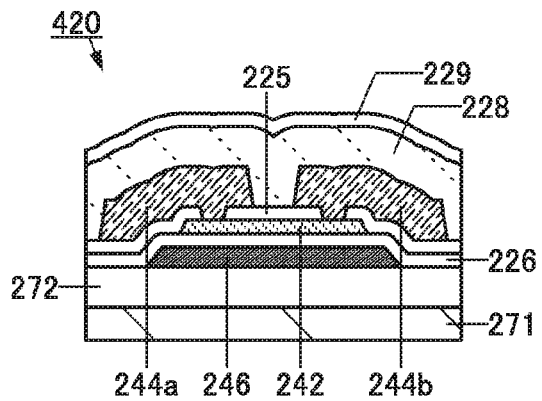
FIG. 10B1
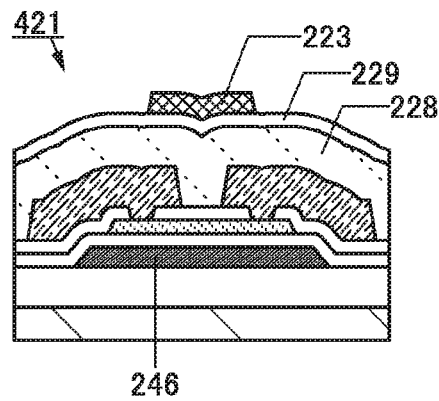
FIG. 10B2
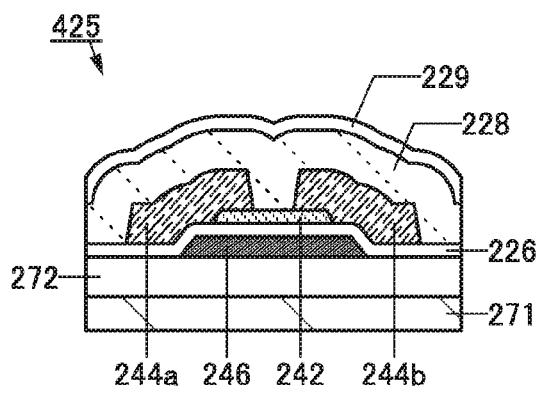
FIG. 10C1
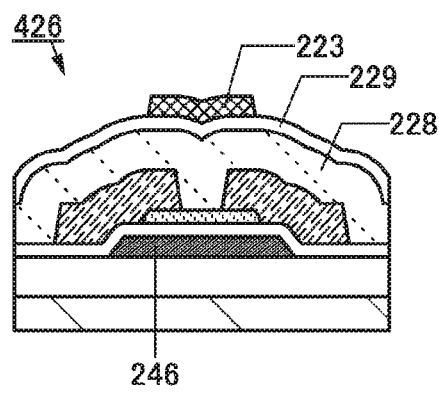
FIG. 10C2

FIG. 11A1
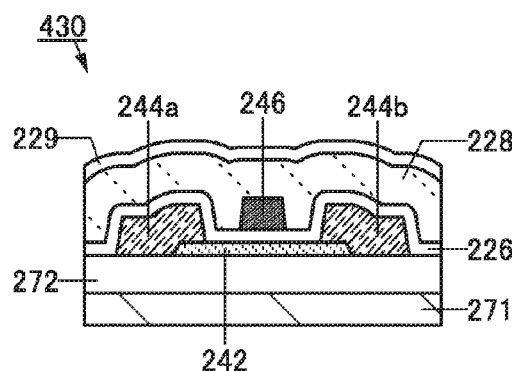
FIG. 11A2
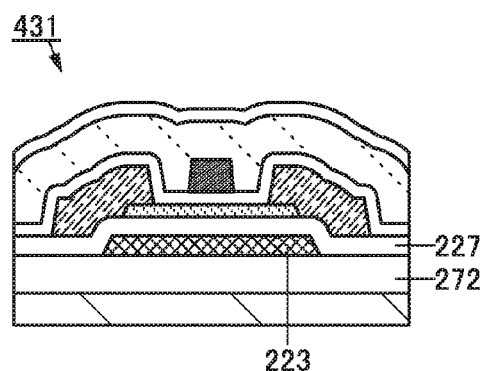
FIG. 11A3
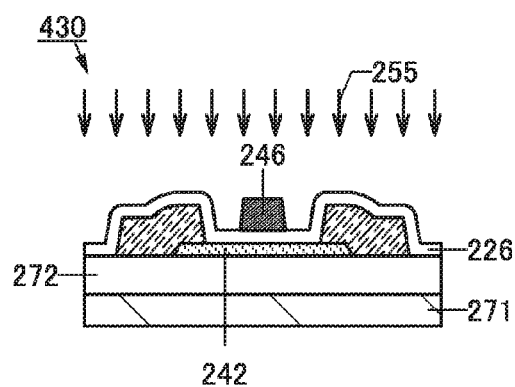
FIG. 11B1
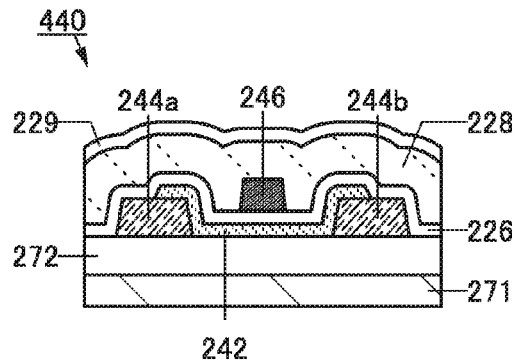
FIG. 11B2
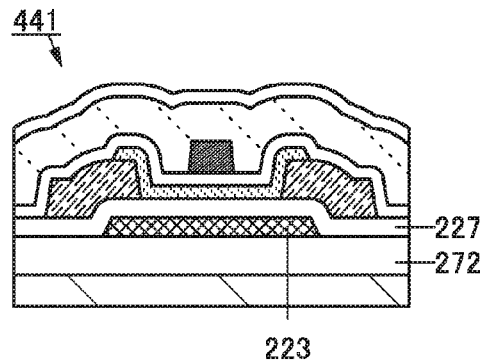

FIG. 12A1
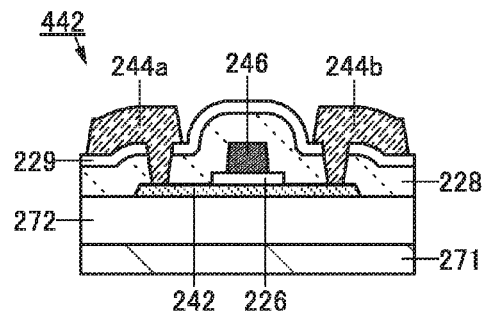
FIG. 12A2
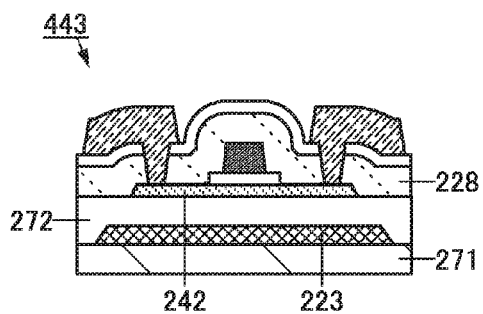
FIG. 12A3
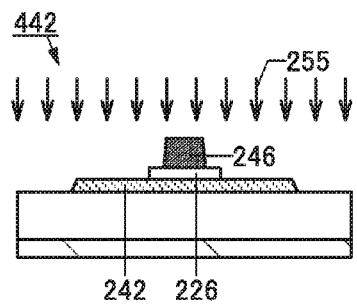
FIG. 12B1
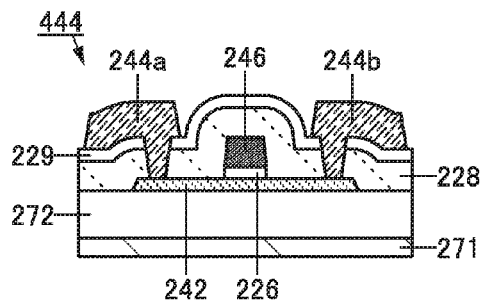
FIG. 12B2
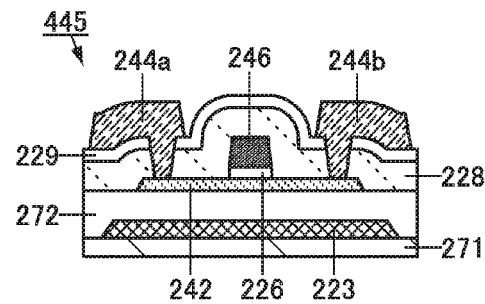
FIG. 12C1
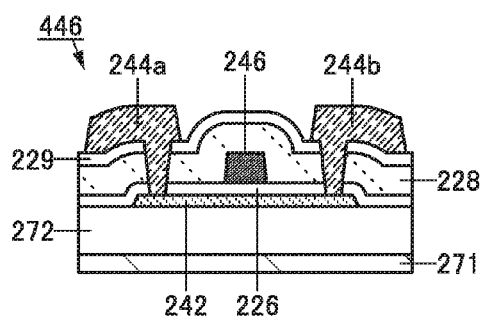
FIG. 12C2
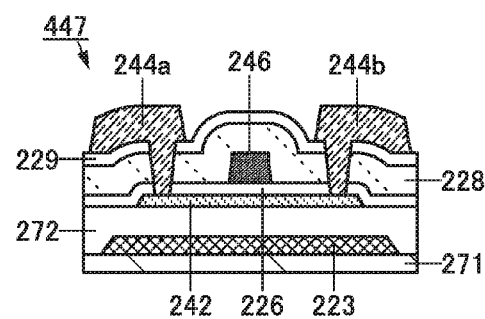

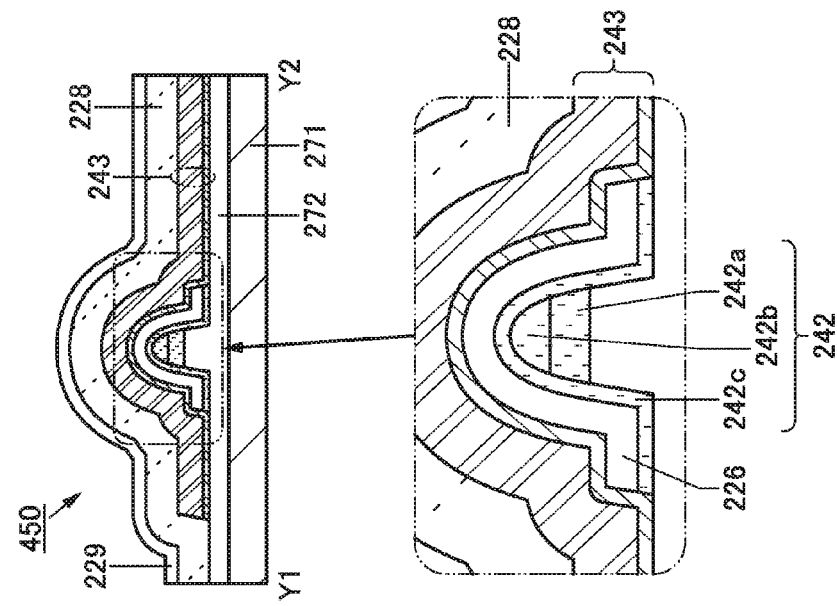
FIG. 13C
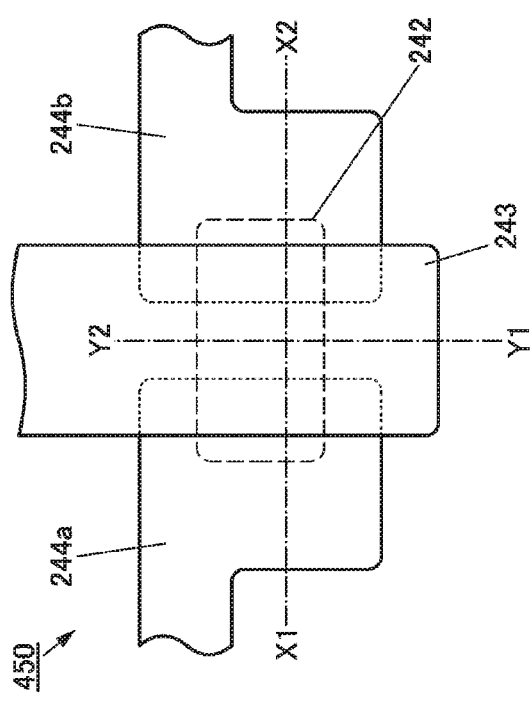
FIG. 13A
FIG. 13B

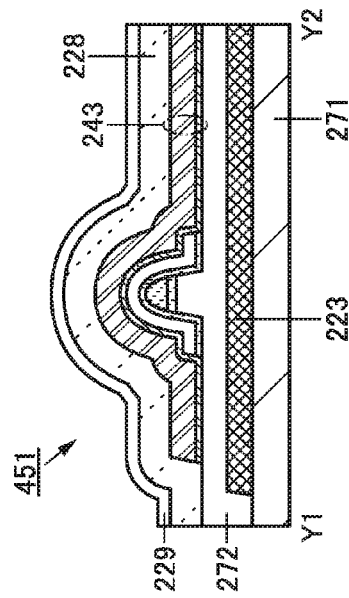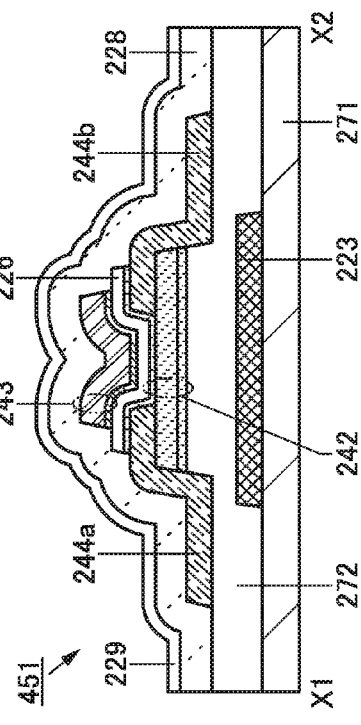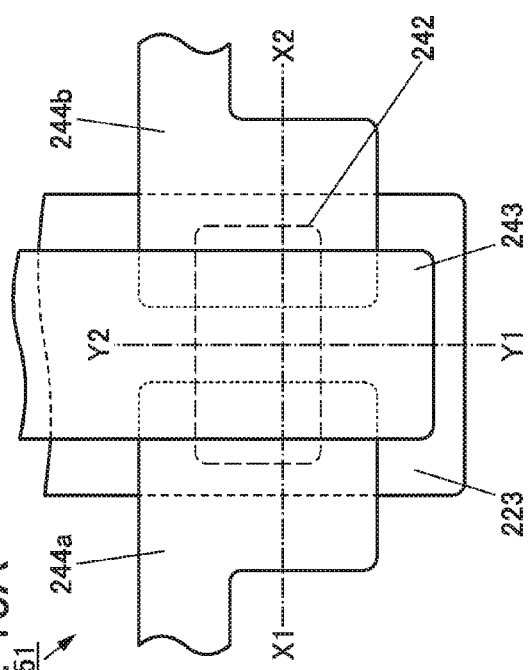

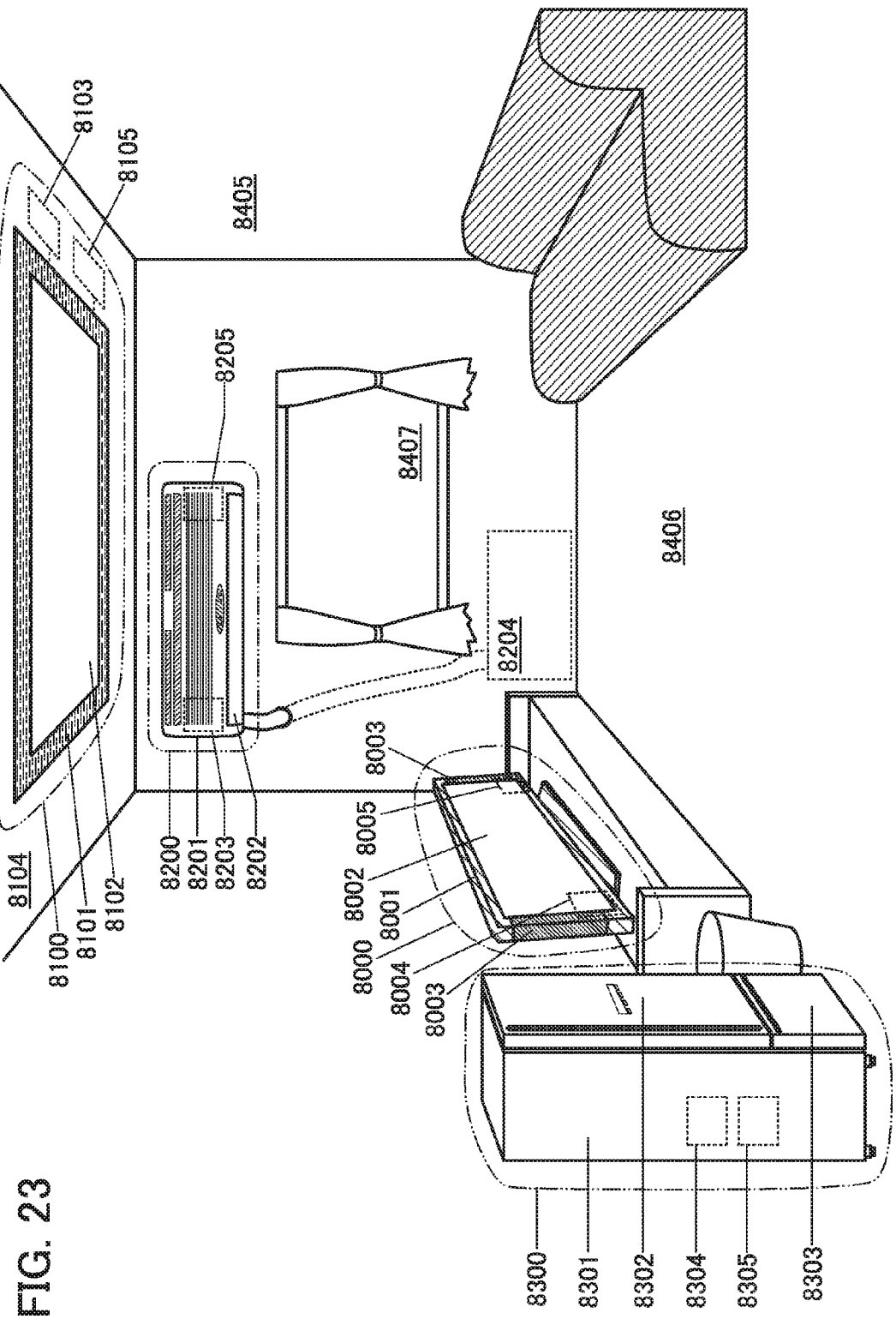

SEMICONDUCTOR DEVICE AND ELECTRONIC DEVICE

BACKGROUND OF THE INVENTION

1. Field of the Invention

One embodiment of the invention disclosed in this specification and the like relates to an object, a method, or a manufacturing method. One embodiment of the invention disclosed in this specification and the like also relates to a process, a machine, manufacture, or a composition of matter. In particular, one embodiment of the invention disclosed in this specification and the like relates to a semiconductor device, or an electronic device including a semiconductor device.

In this specification and the like, the term "semiconductor device" denotes a device that can function by utilizing semiconductor characteristics. A display device (e.g., a liquid crystal display device and a light-emitting display device), a lighting device, an electro-optical device, a power storage device, a memory device, a semiconductor circuit, an imaging device, an electronic device, and the like may include a semiconductor device.

2. Description of the Related Art

In recent years, transistors including an oxide semiconductor in a semiconductor layer where a channel is formed (hereinafter referred to as an "OS transistor") have garnered attention. An oxide semiconductor layer can be formed by a sputtering method or the like, and thus can be used for a semiconductor layer of a transistor in a large display device, for example. In addition, OS transistors can be fabricated by improving parts of a production equipment for transistors including amorphous silicon in a semiconductor layer where a channel is formed; this can reduce the capital investment.

It is known that an OS transistor has an extremely low leakage current in an off state. For example, a low-power CPU and the like utilizing the extremely low leakage current of an OS transistor have been disclosed (see Patent Document 1).

REFERENCE

Patent Document 1: Japanese Published Patent Application No. 2012-257187

SUMMARY OF THE INVENTION

However, it is well known that fabrication of p-channel OS transistors is difficult. As a result, to construct a logic circuit using only OS transistors, the constructed logic circuit need to be a logic circuit including only n-channel transistors.

On the other hand, even if p-channel OS transistors could be fabricated, when both p-channel and n-channel transistors are fabricated separately on one substrate, the number of process steps needed for fabrication increase; this increases the fabrication cost and reduces the productivity. Therefore, thin-film transistors to be fabricated on one substrate are preferably transistors with the same conductivity type. However, the output voltage of a logic circuit constructed with transistors with the same conductivity type drops as much as the threshold voltages of the transistors.

An object of one embodiment of the present invention is to provide a semiconductor device or the like that allows high productivity. Another object of one embodiment of the present invention is to provide a semiconductor device or the like with low power consumption. Another object is to provide a highly reliable semiconductor device or the like. Another object of one embodiment of the present invention is to provide a semiconductor device or the like including a logic circuit including only n-channel transistors. Another object of one embodiment of the present invention is to provide a novel semiconductor device or the like.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device which includes a first transistor, a second transistor, a third transistor, a fourth transistor, and a capacitor. One of a source and a drain of the first transistor is electrically connected to a first wiring. A gate of the first transistor is electrically connected to the first wiring. The other of the source and the drain of the first transistor is electrically connected to one of a source and a drain of the second transistor. The other of the source and the drain of the second transistor is electrically connected to a second wiring. A gate of the second transistor is electrically connected to a gate of the fourth transistor. One of a source and a drain of the third transistor is electrically connected to a third wiring. The other of the source and the drain of the third transistor is electrically connected to one of a source and a drain of the fourth transistor. A gate of the third transistor is electrically connected to the other of the source and the drain of the first transistor. The other of the source and the drain of the fourth transistor is electrically connected to a fourth wiring. One electrode of the capacitor is electrically connected to the gate of the third transistor. The other electrode of the capacitor is electrically connected to the other of the source and the drain of the third transistor.

Another embodiment of the present invention is a semiconductor device which includes a first transistor, a second transistor, a third transistor, a fourth transistor, and a capacitor. Each of the first to fourth transistors includes a first gate and a second gate. The first gate of the first transistor is electrically connected to a first wiring. The second gate of the first transistor is electrically connected to the first wiring. One of a source and a drain of the first transistor is electrically connected to the first wiring. The other of the source and the drain of the first transistor is electrically connected to one of a source and a drain of the second transistor. The other of the source and the drain of the second transistor is electrically connected to a second wiring. The first gate of the second transistor is electrically connected to the second gate of the second transistor. One of a source and a drain of the third transistor is electrically connected to a third wiring. The first gate of the third transistor is electrically connected to the other of the source and the drain of the first transistor. The second gate of the third transistor is electrically connected to the other of the source and the drain of the third transistor. One of a source and a drain of the fourth transistor is electrically connected to the other of the source and the drain of the third transistor. The other of the source and the drain of the fourth transistor is electrically connected to a fourth wiring. The first gate of the fourth transistor is electrically connected to the second gate of the fourth transistor. The first gate of the second transistor is electrically connected to the first gate of the fourth transistor. One electrode of the capacitor is electrically connected to the first gate of the third transistor. The other electrode of the capacitor is electrically connected to the other of the source and the drain of the third transistor. One of the first gate and the second gate in each of the first to fourth transistors functions as a gate, and the other of the first gate and the second gate in each of the first to fourth transistors functions as a back gate.

Any of the above transistors preferably includes an oxide semiconductor in a semiconductor layer in which a channel is formed.

The channel length of the second transistor is preferably shorter than the channel length of the first transistor. In addition, the channel width of the second transistor is preferably longer than the channel width of the first transistor.

A semiconductor device or the like that allows high productivity can be provided. Alternatively, a semiconductor device or the like with low power consumption can be provided. Alternatively, a highly reliable semiconductor device or the like can be provided. Alternatively, a semiconductor device or the like including a logic circuit including only n-channel transistors can be provided. Alternatively, a novel semiconductor device or the like can be provided.

Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF THE DRAWINGS

In the accompanying drawings:

FIGS. 10A1 to 10C2 each illustrates a structure example of a transistor;

FIGS. 11A1 to 11B2 each illustrates a structure example of a transistor;

FIGS. 12A1 to 12C2 each illustrates a structure example of a transistor;

FIGS. 13A to 13C each illustrates a structure example of a transistor;

FIGS. 15A to 15C each illustrates a structure example of a transistor;

FIG. 23 illustrates an example of an electronic device.

DETAILED DESCRIPTION OF THE INVENTION

Figure 1A:
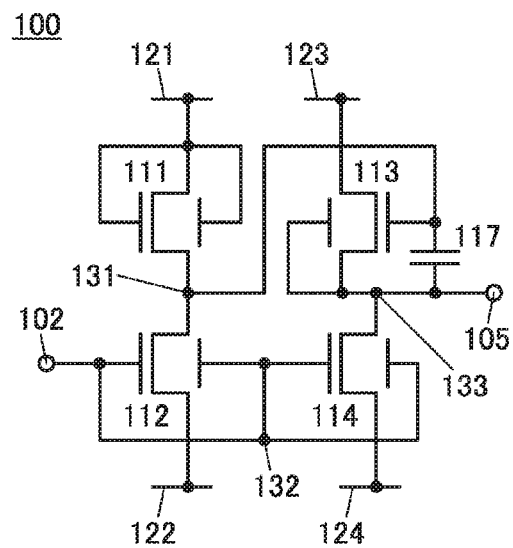
FIGS. 1A to 1D are circuit diagrams illustrating a semiconductor device.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below. Note that in the structures of the invention described below, the same portions or portions having similar functions are denoted by the same reference numerals in different drawings, and description of such portions is not repeated in some cases.

The position, size, range, and the like of each component illustrated in the drawings and the like are not accurately represented in some cases to facilitate understanding of the invention. Therefore, the present invention is not necessarily limited to the position, size, range, or the like disclosed in the drawings and the like.

In the drawings, some components might not be illustrated to facilitate understanding of the invention. In addition, some hidden lines and the like might not be shown.

Note that ordinal numbers such as "first" and "second" in this specification and the like are used in order to avoid confusion among components and do not denote a priority or an order such as the order of steps or the stacking order. A term without an ordinal number in this specification and the like might be provided with an ordinal number in a claim in order to avoid confusion among components. In addition, a term with an ordinal number in this specification and the like might be provided with a different ordinal number in a claim. Moreover, a term with an ordinal number in this specification and the like might not be provided with any ordinal number in a claim.

In addition, in this specification and the like, the term such as an "electrode" or a "wiring" does not limit a function of a component. For example, an "electrode" is used as part of a "wiring" in some cases, and vice versa. Further, the term electrode or wiring can also mean a combination of a plurality of electrodes and wirings formed in an integrated manner.

Note that the term "over" or "under" in this specification and the like does not necessarily mean that a component is placed "directly on" or "directly below" and "directly in contact with" another component. For example, the expression "electrode B over insulating layer A" does not necessarily mean that the electrode B is on and in direct contact with the insulating layer A and can mean the case where another component is provided between the insulating layer A and the electrode B.

Furthermore, functions of the source and the drain might be switched depending on operation conditions, e.g., when a transistor having a different polarity is employed or a direction of current flow is changed in circuit operation; it is therefore difficult to determine the source/drain function of electrodes in a transistor. Thus, the terms "source" and "drain" are used interchangeably in this specification.

In this specification and the like, when it is explicitly described that X and Y are connected, the case where X and Y are electrically connected, the case where X and Y are functionally connected, and the case where X and Y are directly connected are included therein. Accordingly, another element may be provided between elements having a connection relation illustrated in drawings and texts, without being limited to a predetermined connection relation, for example, the connection relation illustrated in the drawings and the texts.

Note that in this specification and the like, the expression "electrically connected" includes the case where components are connected through an "object having any electric function". There is no particular limitation on an object having any electric function as long as electric signals can be transmitted and received between components that are connected through the object. Accordingly, even when the expression "electrically connected" is used in this specification, there may be a case in which no physical connection is made and a wiring is just extended in an actual circuit.

Note that the term "channel length" refers to, for example, a distance between a source (source region or source electrode) and a drain (drain region or drain electrode) in a region where a semiconductor (or a portion where a current flows in a semiconductor when a transistor is on) and a gate electrode overlap with each other or a region where a channel is formed (also referred to as a "channel formation region") in a top view of the transistor. Note that in a given transistor, channel lengths are not necessarily the same in all regions. In other words, the channel length of one transistor is not limited to one value in some cases. Therefore, in this specification, the channel length is any one of values, the maximum value, the minimum value, or the average value in the channel formation region.

The term "channel width" refers to, for example, the length of a portion where a source and a drain face each other in a region where a semiconductor (or a portion where a current flows in a semiconductor when a transistor is on) and a gate electrode overlap with each other, or in the channel formation region. Note that in a given transistor, channel lengths are not necessarily the same in all regions. In other words, a channel width of one transistor is not fixed to one value in some cases. Therefore, in this specification, a channel width is any one of values, the maximum value, the minimum value, or the average value in the channel formation region.

Note that depending on transistor structures, a channel width in a region where a channel is actually formed (also referred to as an "effective channel width") is different from a channel width shown in a top view of a transistor (also referred to as an "apparent channel width") in some cases. For example, when a gate electrode covers the side surfaces of a semiconductor layer in a transistor, an effective channel width is greater than an apparent channel width; in some cases, its impact can be substantial. For example, when a gate electrode covers the side surfaces of a semiconductor in a miniaturized transistor, the proportion of a channel region formed in a side surface of a semiconductor increases. In that case, an effective channel width is greater than an apparent channel width.

In such a case, an effective channel width is difficult to measure in some cases. For example, to estimate an effective channel width from design parameters, the profile of the semiconductor need to be known beforehand. Therefore, when accurate profile information of the semiconductor is not available, accurate measurement of an effective channel width is difficult.

Therefore, in this specification, an apparent channel width is referred to as a surrounded channel width (SCW) in some cases. Further, in this specification, in the case where the term "channel width" is used, it may denote a surrounded channel width or an apparent channel width. Alternatively, in this specification, in some cases where the term "channel width" is used, it may denote an effective channel width. Note that a channel length, a channel width, an effective channel width, an apparent channel width, a surrounded channel width, and the like can be determined by analyzing a cross-sectional TEM image and the like.

Note that the surrounded channel width may be used for calculation, when field effect mobility, a current value per channel width, and the like of a transistor are obtained by calculation. In that case, the obtained value may differ from the value calculated using an effective channel width.

Furthermore, unless otherwise specified, transistors described in this specification and the like are enhancement-type (normally-off-type) field effect transistors.

Note that an impurity in a semiconductor refers to, for example, elements other than the main components of the semiconductor. For example, an element with a concentration lower than 0.1 atomic % can be regarded as an impurity. Inclusion of impurities may cause an increase in density of states (DOS) in a semiconductor, and/or a decrease in the carrier mobility or the crystallinity. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the oxide semiconductor; specifically, they include hydrogen (also included in water), lithium, sodium, silicon, boron, phosphorus, carbon, and nitrogen, for example. Entry of impurities such as hydrogen may form oxygen vacancies within an oxide semiconductor. Further, in the case where the semiconductor is silicon, examples of an impurity which changes characteristics of the semiconductor include oxygen, Group 1 elements except hydrogen, Group 2 elements, Group 13 elements, and Group 15 elements.

In this specification, the term "parallel" indicates that the angle formed between two straight lines is greater than or equal to −10° and less than or equal to 10°. Accordingly, the term "parallel" includes the case where the angle formed between two straight lines is greater than or equal to −5° and less than or equal to 5°. In addition, the term "substantially parallel" indicates that the angle formed between two straight lines is greater than or equal to −30° and less than or equal to 30°. The terms "perpendicular" and "orthogonal" indicates that the angle formed between two straight lines is greater than or equal to 80° and less than or equal to 100°. Accordingly, the terms "perpendicular" and "orthogonal" includes the case where the angle formed between two straight lines is greater than or equal to 85° and less than or equal to 95°. A term "substantially perpendicular" indicates that the angle formed between two straight lines is greater than or equal to 60° and less than or equal to 120°.

In the specification and the like, the terms "identical," "the same," "equal," "uniform," and the like (including synonyms thereof) used in describing calculation values and actual measurement values allow for a margin of error of 20% unless otherwise specified.

In this specification, in the case where an etching step is performed after a photolithography process, a resist mask formed in the photolithography process is removed after the etching step, unless otherwise specified.

In this specification and the like, a high power supply potential $V_{DD}$ (hereinafter also simply referred to as $V_{DD}$ or H potential) is a power supply potential higher than a low power supply potential $V_{SS}$. The low power supply potential $V_{SS}$ (hereinafter also simply referred to as $V_{SS}$ or L potential) is a power supply potential lower than the high power supply potential $V_{DD}$. In addition, a ground potential can be used as $V_{DD}$ or $V_{SS}$. For example, in the case where a ground potential is used as $V_{DD}$, $V_{SS}$ is lower than the ground potential, and in the case where a ground potential is used as $V_{SS}$, $V_{DD}$ is higher than the ground potential.

A voltage usually refers to a potential difference between a given potential and a reference potential (e.g., a ground potential (GND potential) or a source potential). Note that a "potential" is a relative concept, and a potential supplied to wirings or the like may be changed depending on a reference potential. Therefore, the terms "voltage" and "potential" can be used interchangeably in some cases. Note that in this specification and the like, $V_{SS}$ is the reference voltage unless otherwise specified.

Note that the terms "film" and "layer" can be used interchangeably depending on the case or the circumstances. For example, the term "conductive layer" can be changed into the term "conductive film" in some cases. Also, the term "insulating film" can be changed into the term "insulating layer" in some cases.

In this specification, trigonal and rhombohedral crystal systems are included in a hexagonal crystal system.
(Embodiment 1)

In this embodiment, a semiconductor device 100 of one embodiment of the present invention will be described with reference to drawings. FIG. 1A is a circuit diagram illustrating a structure of the semiconductor device 100.
<Structure Example of Semiconductor Device 100>

The semiconductor device 100 illustrated in FIG. 1A includes transistors 111 to 114 and a capacitor 117. The transistors 111 to 114 are n-channel transistors each having a source, a drain, a gate, and a back gate.

The gate and the back gate are positioned so that the channel formation region of a semiconductor layer is provided between the gate and the back gate. Thus, the back gate electrode can function in a manner similar to that of the gate electrode. Note that the back gate potential can be the same as the gate potential, the ground potential (GND potential), or an arbitrary potential. By changing the back gate potential independently of the gate potential, the threshold voltage of the transistor can be changed. In this specification and the like, the term "first gate" may refer to one of the gate and the back gate, and the term "second gate" may refer to the other of the gate and the back gate.

In the semiconductor device 100 illustrated in FIG. 1A, first and second gates of the transistor 111 are electrically connected to a wiring 121, one of a source and a drain of the transistor 111 is electrically connected to the wiring 121, and the other of the source and the drain of the transistor 111 is electrically connected to a node 131. In addition, one of a source and a drain of the transistor 112 is electrically connected to the node 131, the other of the source and the drain of the transistor 112 is electrically connected to a wiring 122, and first and second gates of the transistor 112 are electrically connected to a node 132. In addition, one of a source and a drain of the transistor 113 is electrically connected to a wiring 123, the other of the source and the drain of the transistor 113 is electrically connected to a node 133, one of first and second gates of the transistor 113 is electrically connected to the node 133, and the other of the first and second gates of the transistor 113 is electrically connected to the node 131. Furthermore, one of a source and a drain of the transistor 114 is electrically connected to the node 133, the other of the source and the drain of the transistor 114 is electrically connected to a wiring 124, and first and second gates of the transistor 114 are electrically connected to the node 132. Furthermore, one electrode of the capacitor 117 is electrically connected to the node 131, and the other electrode of the capacitor 117 is electrically connected to the node 133. Furthermore, the node 132 is electrically connected to a terminal 102, and the node 133 is electrically connected to a terminal 105.

Providing a back gate in addition to a gate enlarges the area where carriers flow when the transistor is on, in the film thickness direction; this increases the mobility of the carriers. As a result, the on-state current and the field-effect mobility of the transistor increases. Thus, a transistor with a back gate enables a reduction of the occupied area when compared to a transistor without a back gate, when the required on-state current is the same for both transistors. Furthermore, by surrounding the semiconductor layer with the gate and the back gate, effects of external electric fields on the channel formation region can be reduced, thereby improving the reliability of the semiconductor device. Note that back gates will be explained in later sections in more detail.

Figure 1B:
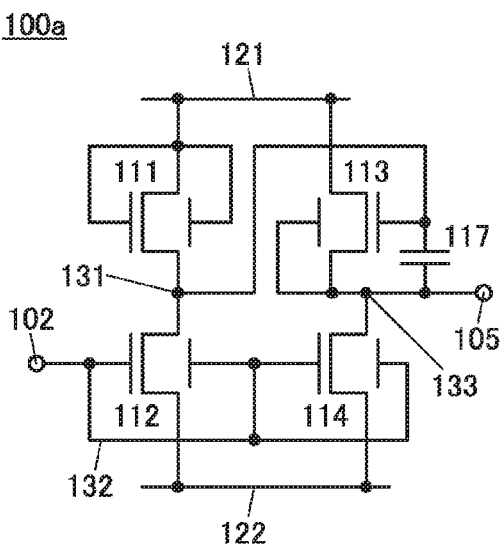

When the same potential is supplied to the wirings 121 and 123, one of the wirings 121 and 123 may be omitted. When the same potential is supplied to the wirings 122 and 124, one of the wirings 122 and 124 may be omitted. In a semiconductor device 100a illustrated in FIG. 1B, one of the source and the drain of the transistor 111 and one of the source and the drain of the transistor 113 are electrically connected to the wiring 121. Furthermore, the other of the source and the drain of the transistor 112 and the other of the source and the drain of the transistor 114 are electrically connected to the wiring 122.

Figure 1C:
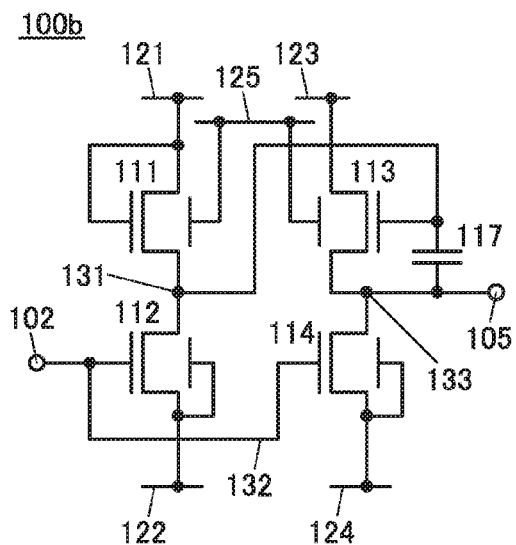

One of the first and second gates of the transistor 112 may be electrically connected to the wiring 122, as in a semiconductor device 100b illustrated in FIG. 1C. One of the first and second gates of transistor 114 may be electrically connected to the wiring 124. One of the first and second gates of the transistor 111 and one of the first and second gates of the transistor 113 may be electrically connected to a wiring 125. Note that the wiring 125 will be supplied with a potential such as $V_{SS}$, or a potential equivalent to the potential supplied to wirings 122 and 124.

Figure 1D:
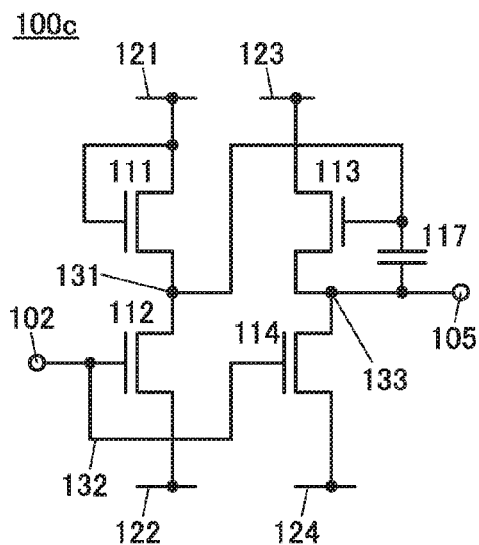

Depending on necessity, some or all of the transistors included in the semiconductor device 100 may be transistors that do not utilize back gates. FIG. 1D shows a circuit diagram of a semiconductor device 100c; the semiconductor device 100c is a derivative of the semiconductor device 100, and includes transistors that do not include back gates.

OS transistors are preferably used as the transistors 111 to 114. The oxide semiconductor has a band gap of 2 eV or more; therefore, an OS transistor has an extremely small off-state current. Specifically, the off-state current per micrometer in channel width at room temperature (25° C.) and at a source-drain voltage of 3.5 V can be lower than $1 \times 10^{-20}$ A, lower than $1 \times 10^{-22}$ A, or lower than $1 \times 10^{-24}$ A. That is, the on/off ratio of the transistor can be greater than or equal to 20 digits and less than or equal to 150 digits. An OS transistor has a high dielectric breakdown voltage between its source and drain. Thus, with use of the OS transistor, a semiconductor device for high power application can be provided.

<Operation Example of Semiconductor Device 100>

The semiconductor device 100 can function as an inverter circuit. Specifically, an L potential is output from the terminal 105 when an H potential is input to the terminal 102, and an H potential is output from the terminal 105 when an L potential is input to the terminal 102.

An operation example of the semiconductor device 100 is described with reference to a timing chart in FIG. 2 and circuit diagrams in FIGS. 3A and 3B, and FIGS. 4A and 4B. In this example, it is assumed that the wirings 121 and 123 are supplied with an H potential ($V_{DD}$), and the wirings 122 and 124 are supplied with an L potential ($V_{SS}$). Furthermore, it is assumed that the threshold voltages of the transistors 111 to 114 are the same, which will be denoted as "$V_{th}$" in this specification and the like. In addition, it is assumed that $V_{th}$ is higher than 0 volts and lower than ($V_{DD}-V_{SS}$)/2.

<Period 151: H Potential Input Period>

In a period 151, when an H potential is input to the terminal 102, the potential at the node 132 becomes an H potential, thereby turning on the transistors 112 and 114. After this, each of the potentials of the nodes 131 and 133 becomes an L potential, thereby turning off the transistor 113. In addition, an L potential is output from the terminal 105 which is electrically connected to the node 133 (refer to FIG. 3A).

The transistors 111 and 112 are turned on simultaneously. Therefore, to bring the potential of the node 131 closer to an L potential, the on-state resistance (resistance between a source and a drain when a transistor is on) of the transistor 112 is preferably made lower than that of the transistor 111. This can be achieved by making the channel length of the transistor 112 shorter than that of the transistor 111, for example. Specifically, the channel length of the transistor 112 can be ½ or less, preferably ⅕ or less, more preferably 1/10 or less, and further preferably 1/20 or less of the channel length of the transistor 111. This can also be achieved by making the channel width of the transistor 112 longer than that of the transistor 111, for example. Specifically, the channel width of the transistor 112 can be longer than the channel width of the transistor 111 by 2 times or more, preferably 5 times or more, more preferably 10 times or more, and further preferably 20 times or more. Furthermore, the transistor 112 may be a transistor including a back gate, and the transistor 111 may be a transistor that does not include a back gate, for example.

<Period 152: L Potential Input Period>

In a period 152, when an L potential is input to the terminal 102, the potential at the node 132 becomes an L potential, thereby turning off the transistors 112 and 114. After that, a potential is supplied from the wiring 121 through the transistor 111 to the node 131. At this time, the potential at the node 131 is $V_{DD}-V_{th}$ (refer to FIG. 3B).

Figure 3A:
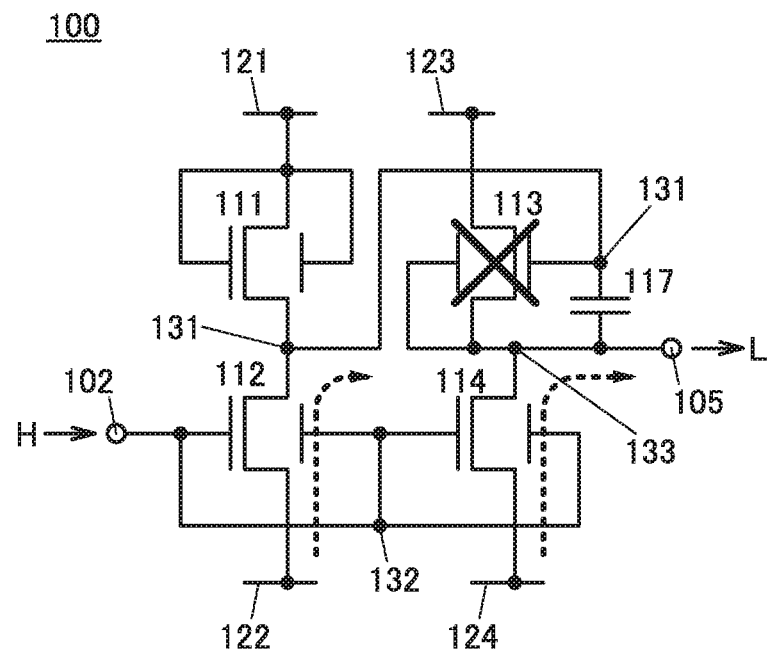
FIGS. 3A and 3B are circuit diagrams each illustrating an operation of a semiconductor device.
Figure 3B:
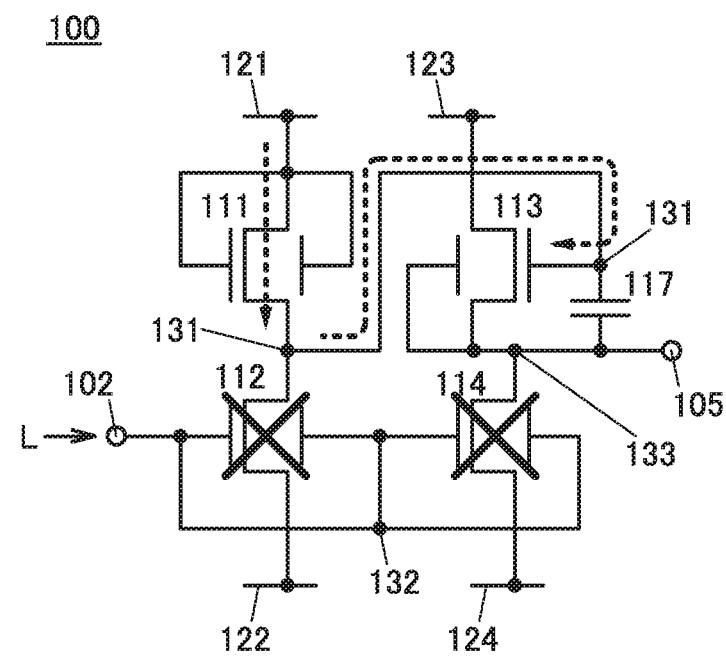
Figure 4A:
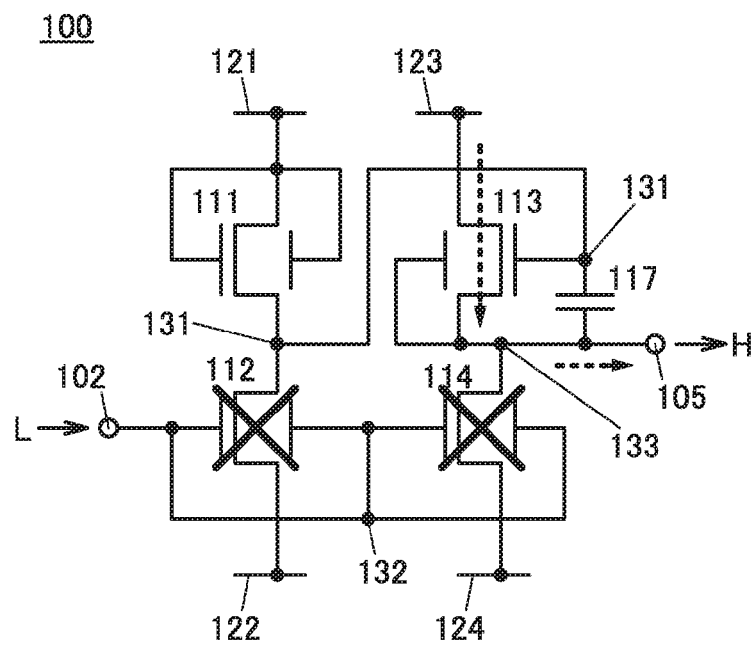
FIGS. 4A and 4B are circuit diagrams each illustrating operation of a semiconductor device.
Figure 4B:
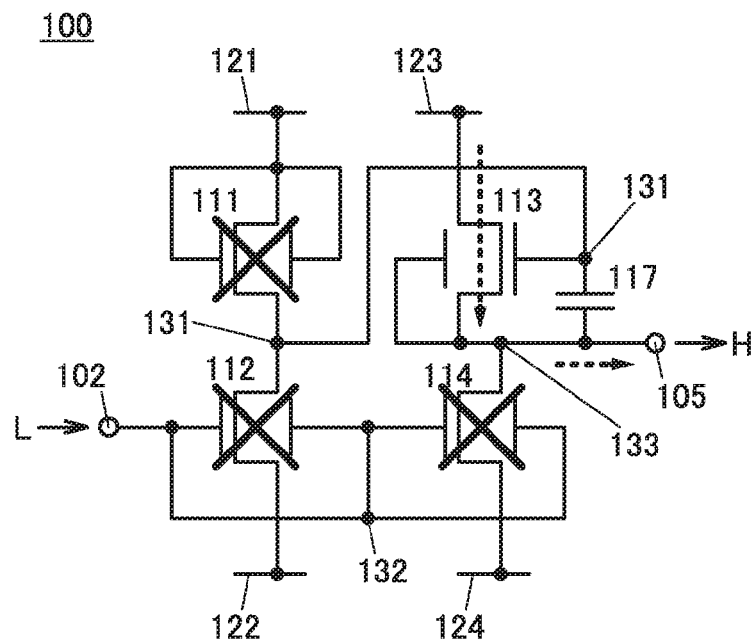

The potential at the node 131 is higher than $V_{th}$; thus, the transistor 113 is turned on (refer to FIG. 3B). After that, a potential is supplied from the wiring 123 through the transistor 113 to the node 133 (refer to FIG. 4A). At this time, the potential at the node 133 is $V_{DD}-V_{th}$.

When a potential is supplied to the node 133, the potential of the node 131 increases; this is because the nodes 133 and 131 are capacitively coupled with each other through the capacitor 117. Specifically, the potential of the node 131 becomes $2\times(V_{DD}-V_{th})$. In addition, the potential of the node 133 ultimately becomes equal to that of the wiring 123. Accordingly, the potential of the node 131 rises to a potential that is close to $2\times V_{DD}-V_{th}$. Accordingly, the transistor 111 is turned off. Furthermore, an H potential ($V_{DD}$) is output from the terminal 105 (refer to FIG. 4B).

<Modification Example 1>

Figure 5A:
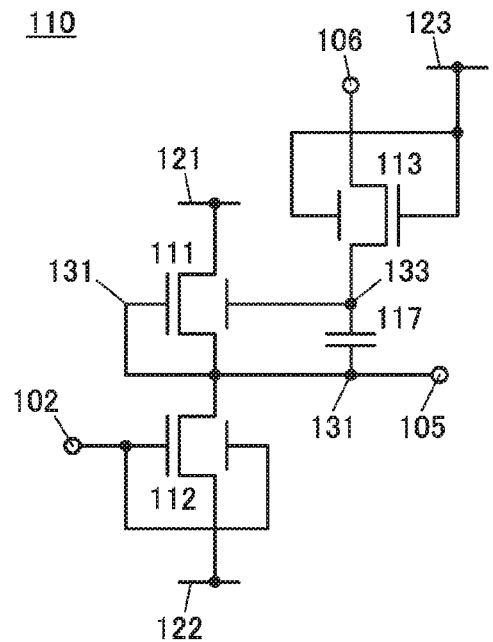
FIGS. 5A to 5D are circuit diagrams each illustrating a semiconductor device.

FIG. 5A is a circuit diagram that illustrates a semiconductor device 110, which has a different configuration from that of the semiconductor device 100. The semiconductor device 110 includes the transistors 111 to 113 and the capacitor 117. The semiconductor device 110 includes fewer transistors than the semiconductor device 100; thus, the area occupied by the semiconductor device 110 is smaller than that of the semiconductor device 100. Note that in this description, focus will be put on the differences between the semiconductor devices 110 and 100, to avoid repetition of description.

<Configuration Example of Semiconductor Device 110>

In the semiconductor device 110 illustrated in FIG. 5A, one of the source and the drain of the transistor 111 is electrically connected to the wiring 121, the other of the source and the drain and the first gate of the transistor 111 are electrically connected to the node 131, and the second gate of the transistor 111 is electrically connected to the node 133. In addition, in the transistor 112, one of the source and the drain is electrically connected to the node 131, the other of the source and the drain is electrically connected to the wiring 122, and the first and second gates are electrically connected to the terminal 102. Furthermore, in the transistor 113, one of the source and the drain is electrically connected to a terminal 106, the other of the source and the drain is electrically connected to the node 133, and the first and second gates are electrically connected to the wiring 123. One electrode of the capacitor 117 is electrically connected to the node 131, and the other electrode of the capacitor 117 is electrically connected to the node 133. The node 131 is electrically connected to the terminal 105.

Figure 5B:
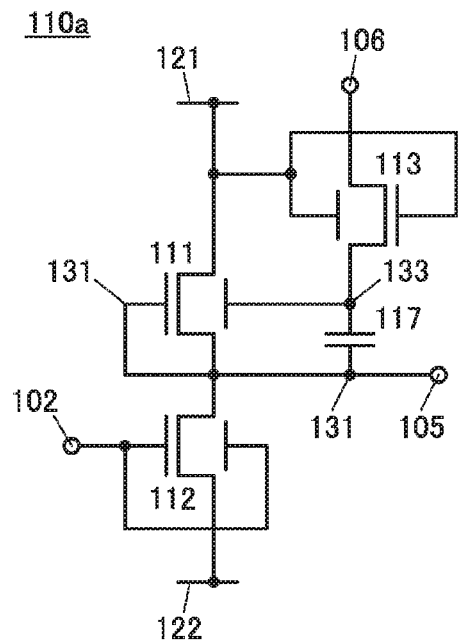

When the same potential is supplied to both the wirings 121 and 123, one of the wirings 121 and 123 may be omitted. In a semiconductor device 110a illustrated in FIG. 5B, the first and second gates of the transistor 113 are electrically connected to the wiring 121.

Figure 5C:
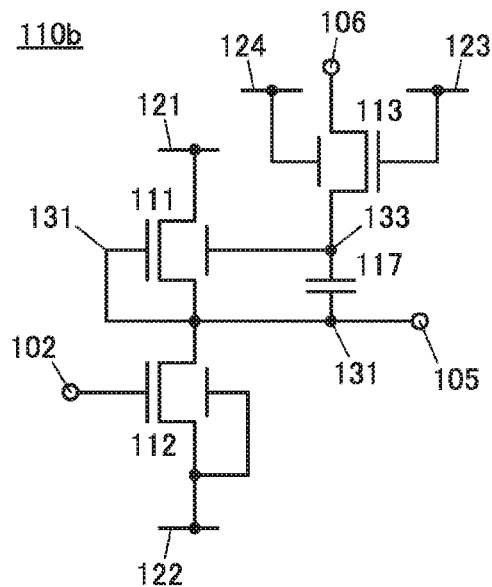

As in a semiconductor device 110b shown in FIG. 5C, the first and second gates of the transistor 112 may be electrically connected to the wiring 122. One of the first and second gates of the transistor 113 may be electrically connected to the wiring 124. Note that the wiring 124 is supplied with $V_{SS}$.

Figure 5D:
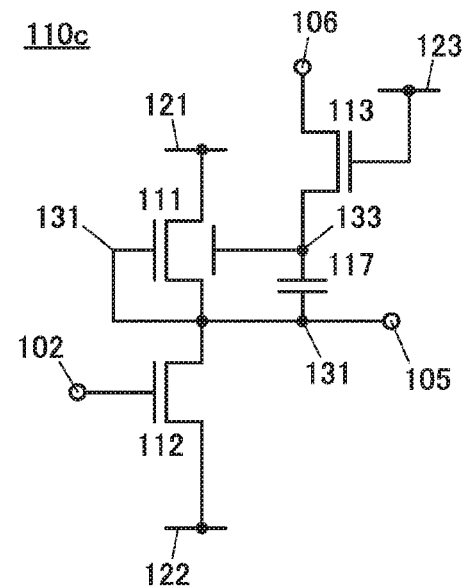

Depending on necessity, at least one of the transistors 112 and 113 may be a transistor that does not include a back gate. A semiconductor device 110c is a modification example of the semiconductor device 110, in which both of the transistors 112 and 113 are transistors that do not include back gates. The circuit diagram of the semiconductor device 110c is shown in FIG. 5D.

<Operation Example of Semiconductor Device 110>

The semiconductor device 110 can function as an inverter circuit. Specifically, when an H potential is input to the terminal 102, an L potential is output from the terminal 105. When an L potential is input to the terminal 102, an H potential is output from the terminal 105.

Different potentials are supplied to the terminals 102 and 106. Specifically, when an H potential is supplied to the terminal 102, an L potential is supplied to the terminal 106. When an L potential is supplied to the terminal 102, an H potential is supplied to the terminal 106.

Figure 6:
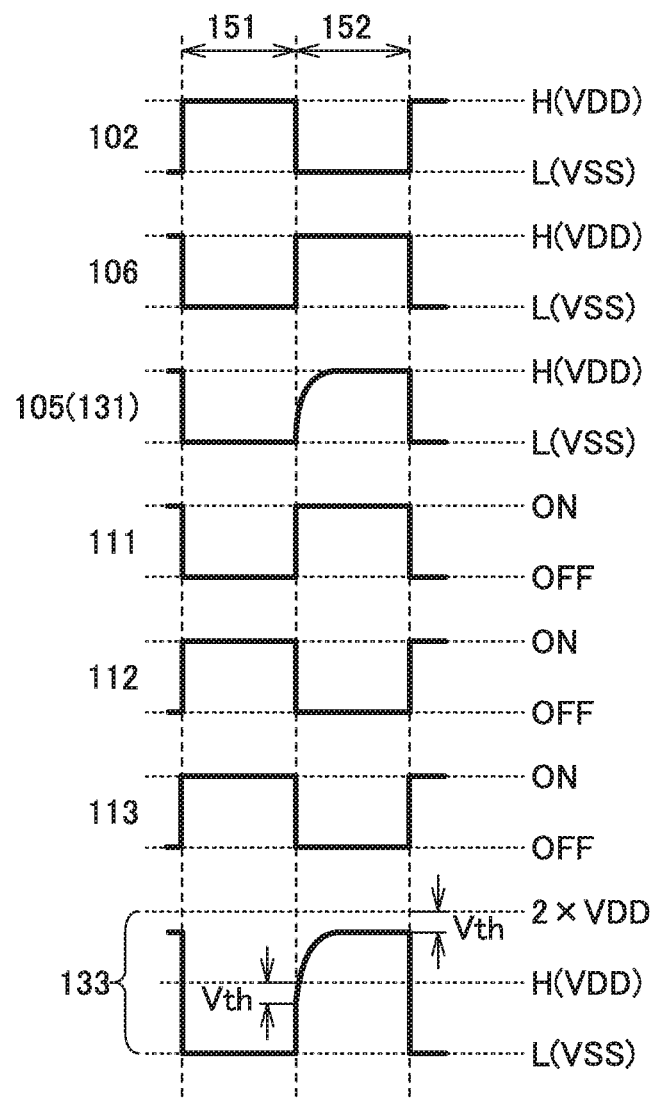
FIG. 6 is a timing chart illustrating an operation of a semiconductor device.
Figure 7A:
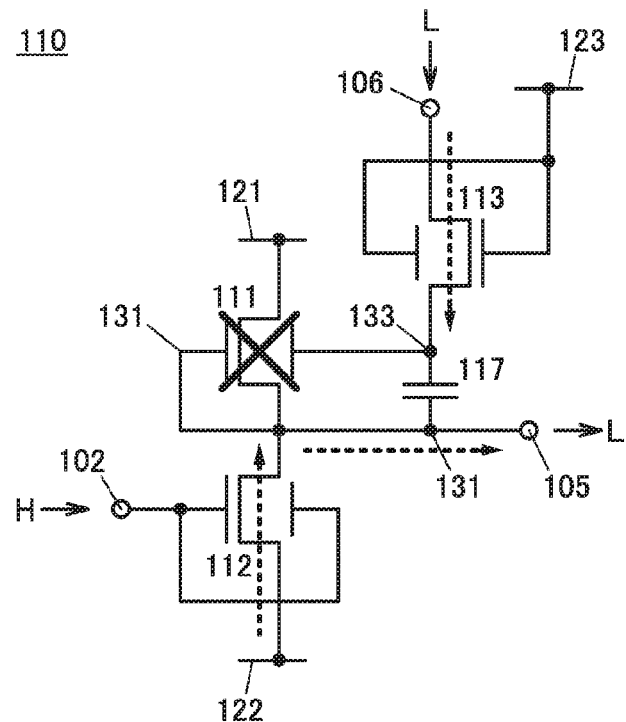
FIGS. 7A and 7B are circuit diagrams illustrating an operation of a semiconductor device.

An operation example of the semiconductor device 110 is described with reference to a timing chart in FIG. 6 and circuit diagrams in FIGS. 7A and 7B and FIG. 8.

<Period 151: H Potential Input Period>

In the period 151, an H potential is input to the terminal 102, and an L potential is input to the terminal 106. As a result, the transistors 112 and 113 are turned on, and an L potential is supplied to the nodes 131 and 133. In addition, the terminal 105 electrically connected to the node 131 outputs an L potential (refer to FIG. 7A).

Note that in the semiconductor device 110, the transistors 111 and 112 are not turned on at the same time. Therefore, there are no restrictions on the on-state resistance of the transistors 111 and 112, which exist in the case of the semiconductor device 100.

<Period 152: L Potential Input Period>

In the period 152, an L potential is input to the terminal 102, and an H potential is input to the terminal 106. As a result, the transistor 112 is turned off. Furthermore, a potential is supplied from the terminal 106 through the transistor 113 to the node 133. At this time, an H potential ($V_{DD}$) is being supplied from the wiring 123 to the gate of the transistor 113; therefore, the potential of the node 131 becomes $V_{DD}-V_{th}$ (refer to FIG. 7B).

Figure 7B:
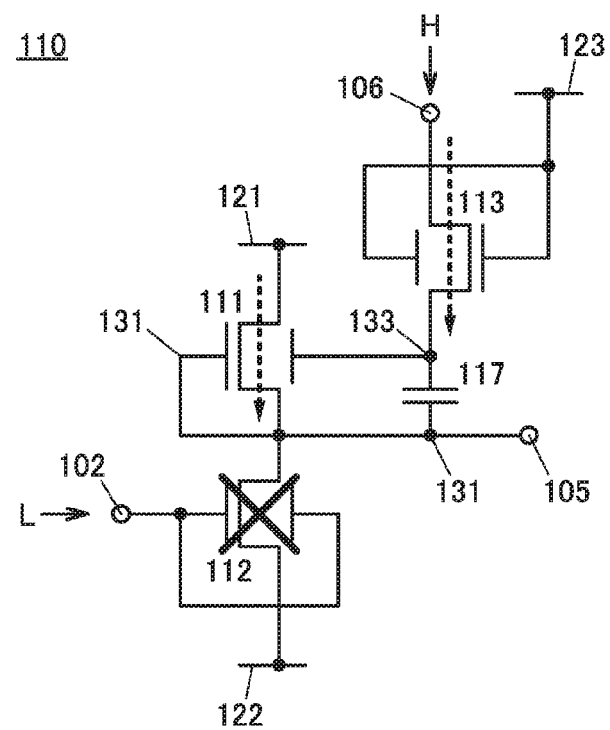
Figure 8:
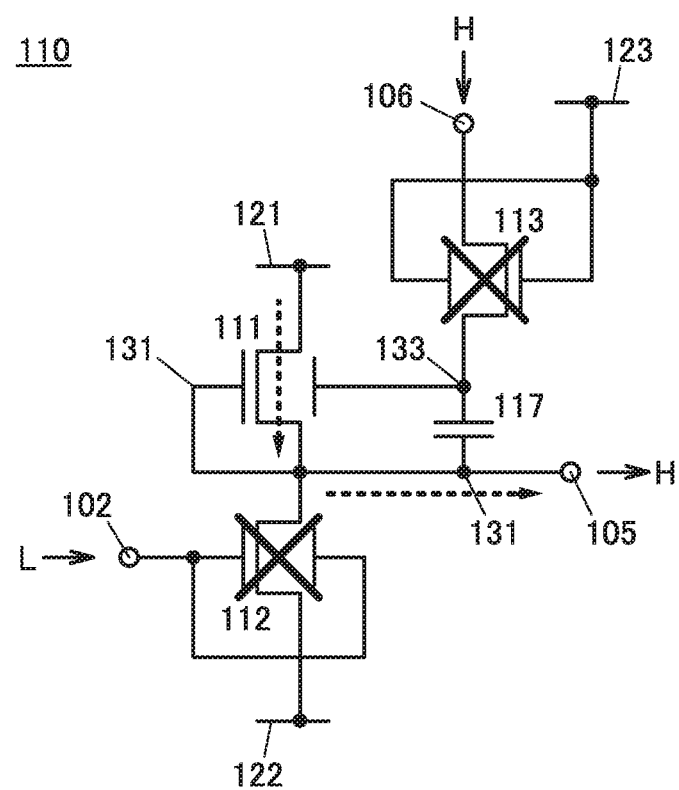
FIG. 8 is a circuit diagram illustrating an operation of a semiconductor device.

Furthermore, the potential of the node 133 is higher than $V_{th}$, which turns on the transistor 111 (refer to FIG. 7B). As a result, a potential is supplied from the wiring 121 through the transistor 111 to the node 131.

When a potential is supplied to the node 131, the potential of the node 133 rises. The node 133 is electrically connected to the node 131 through the capacitor 117. Ultimately, the potential of the node 133 rises to the vicinity of $2 \times V_{DD}-V_{th}$. Accordingly, the transistor 113 is turned off. In addition, an H potential ($V_{DD}$) is output from the terminal 105 (refer to FIG. 8).

<Modification Example 2>

Figure 9A:
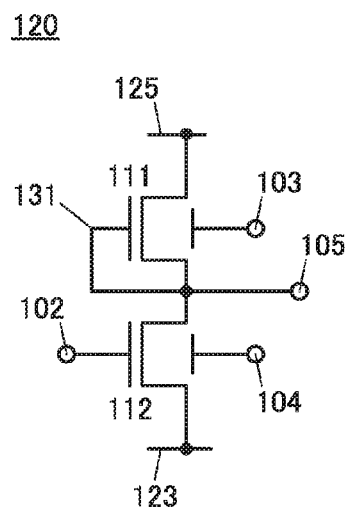
FIGS. 9A to 9D are circuit diagrams each illustrating a semiconductor device.

FIG. 9A shows the circuit diagram of a semiconductor device with further reduction in the number of transistors from the semiconductor device 110. A semiconductor device 120 illustrated in FIG. 9A includes the transistors 111 and 112. The semiconductor device 120 includes fewer transistors than the semiconductor device 110; thus the area occupied by the semiconductor device 120 is smaller than that of the semiconductor device 110.

<Configuration Example of Semiconductor Device 120>

In the transistor 111 of the semiconductor device 120 illustrated in FIG. 9A, one of the source and the drain is electrically connected to the wiring 125, the other of the source and the drain and the first gate are electrically connected to the node 131, and the second gate is electrically connected to the terminal 103. Furthermore, in the transistor 112, one of the source and the drain is electrically connected to the node 131, the other of the source and the drain is connected to the wiring 123, one of the first and second gates is electrically connected to the terminal 102, and the other of the first and second gates is electrically connected to the terminal 104. In addition, the node 131 is electrically connected to the terminal 105.

Figure 9B:
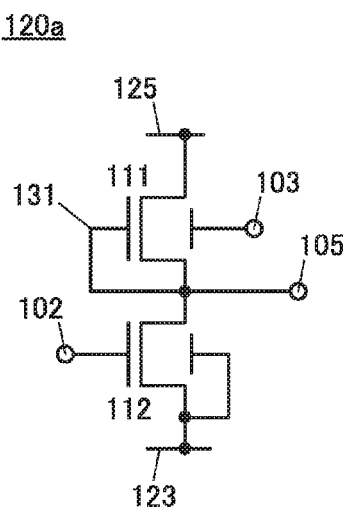

One of the first and second gates of the transistor 112 may be electrically connected to the wiring 123, as in a semiconductor device 120a illustrated in FIG. 9B. The semiconductor device 120a enables a reduction in the number of input terminals compared to the semiconductor device 120, thereby allowing a higher productivity of the semiconductor device.

<Operation Example of the Semiconductor Device 120>

The semiconductor device 120 can function as an inverter circuit. Specifically, when an H potential is input to the terminals 102 and 104, and an L potential is input to the terminal 103, an L potential is output from the terminal 105. In addition, when an L potential is input to the terminals 102 and 104, and an H potential is input to the terminal 103, $V_{DD}-V_{th}$ is output from the terminal 105. Note that a potential that is greater than or equal to $V_{DD}+V_{th}$ may be input to the terminal 103 to output an H potential from the terminal 105.

<Modification Example 3>

Figure 9C:
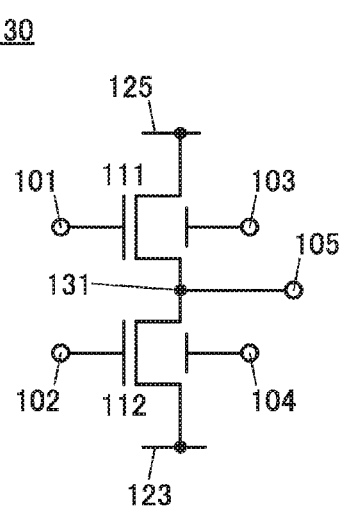

FIG. 9C shows the circuit diagram of a semiconductor device with further reduction in the number of transistors from the semiconductor device 110. A semiconductor device 130 illustrated in FIG. 9C includes the transistors 111 and 112. The semiconductor device 130 includes fewer transistors than the semiconductor device 110; thus the area occupied by the semiconductor device 130 may be smaller than that of the semiconductor device 110.

<Configuration Example of Semiconductor Device 130>

In the semiconductor device illustrated in FIG. 9C, one of the source and the drain of the transistor 111 is electrically connected to the wiring 125, the other of the source and the drain of the transistor 111 is electrically connected to the node 131, one of the first and second gates of the transistor 111 is electrically connected to the terminal 101, and the other of the first and second gates of the transistor 111 is electrically connected to the terminal 103. In addition, one of the source and the drain of the transistor 112 is electrically connected to the node 131, the other of the source and the drain of the transistor 112 is electrically connected to the wiring 123, one of the first and second gates of the transistor 112 is electrically connected to the terminal 102, and the other of the first and second gates of the transistor 112 is electrically connected to the terminal 104. In addition, the node 131 is electrically connected to the terminal 105.

Figure 9D:
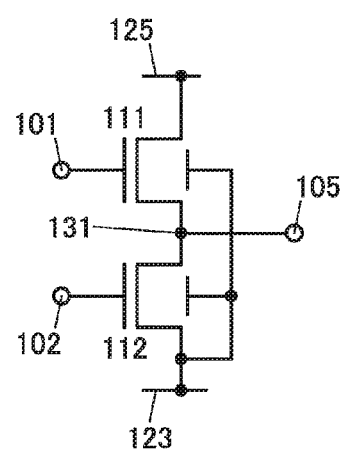

As in a semiconductor device 130a shown in FIG. 9D, one of the first and second gates of the transistor 111 may be electrically connected to the wiring 123. One of the first and second gates of the transistor 112 may be electrically connected to the wiring 123. The semiconductor device 130a enables a reduction in the number of input terminals compared to the semiconductor device 130, thereby allowing a higher productivity of the semiconductor device.

<Operation Example of Semiconductor Device 130>

The semiconductor device 130 can function as an inverter circuit. Specifically, when an H potential is input to the terminals 102 and 104, and an L potential is input to the terminals 101 and 103, an L potential is output from the terminal 105. In addition, when an L potential is input to the terminals 102 and 104, and an H potential is input to the terminals 101 and 103, $V_{DD}-V_{th}$ is output from the terminal 105. Note that to output an H potential from the terminal 105, a potential greater than or equal to $V_{DD}+V_{th}$ may be input to the terminals 101 and 103.

This embodiment can be implemented in an appropriate combination with any of the structures described in the other embodiments.

(Embodiment 2)

In this embodiment, examples of a transistor that can be used for the semiconductor device described in the above embodiments are described.

The semiconductor device in one embodiment of the present invention can be manufactured by using a transistor with any of various structures, such as a bottom-gate transistor and a top-gate transistor. Therefore, a material for a semiconductor layer or the structure of a transistor can be easily changed to comply with the existing production line.

[Bottom-Gate Transistor]

FIG. 10A1 is a cross-sectional view of a channel-protective transistor 410 that is a kind of bottom-gate transistor. The transistor 410 includes an electrode 246 over a substrate 271 with an insulating layer 272 positioned therebetween. The transistor 410 includes a semiconductor layer 242 over the electrode 246 with an insulating layer 226 positioned therebetween. The electrode 246 can function as a gate electrode. The insulating layer 226 can function as a gate insulating layer.

The transistor 410 includes an insulating layer 225 over a channel formation region in the semiconductor layer 242. The transistor 410 includes an electrode 244*a* and an electrode 244*b* which are partly in contact with the semiconductor layer 242 and over the insulating layer 226. Part of the electrode 244*a* and part of the electrode 244*b* are formed over the insulating layer 225.

The insulating layer 225 can function as a channel protective layer. With the insulating layer 225 provided over the channel formation region, the semiconductor layer 242 can be prevented from being exposed at the time of forming the electrodes 244*a* and 244*b*. Thus, the channel formation region in the semiconductor layer 242 can be prevented from being etched at the time of forming the electrodes 244*a* and 244*b*. According to one embodiment of the present invention, a transistor with favorable electrical characteristics can be provided.

The transistor 410 includes an insulating layer 228 over the electrode 244*a*, the electrode 244*b*, and the insulating layer 225 and further includes an insulating layer 229 over the insulating layer 228.

In the case where an oxide semiconductor is used for the semiconductor layer 242, a material that is capable of removing oxygen from part of the semiconductor layer 242 to generate oxygen vacancies is preferably used at least for regions of the electrodes 244*a* and 244*b* that are in contact with the semiconductor layer 242. The carrier concentration of the regions of the semiconductor layer 242 in which oxygen vacancies are generated is increased, so that the regions become n-type regions (n$^+$ layers). Accordingly, the regions can function as a source region and a drain region. Examples of the material that is capable of removing oxygen from the oxide semiconductor to generate oxygen vacancies include tungsten and titanium.

Formation of the source region and the drain region in the semiconductor layer 242 makes it possible to reduce contact resistance between the semiconductor layer 242 and the electrode 244*a* and contact resistance between the semiconductor layer 242 and the electrode 244*b*. Accordingly, the electrical characteristics of the transistor, such as field-effect mobility and threshold voltage, can be favorable.

In the case where a semiconductor such as silicon is used for the semiconductor layer 242, a layer that functions as an n-type semiconductor or a p-type semiconductor is preferably provided between the semiconductor layer 242 and the electrode 244*a* and between the semiconductor layer 242 and the electrode 244*b*. The layer that functions as an n-type semiconductor or a p-type semiconductor can function as a source region or a drain region in the transistor.

The insulating layer 229 is preferably formed using a material that can prevent or reduce diffusion of impurities into the transistor from the outside. The formation of the insulating layer 229 can be omitted as necessary.

When an oxide semiconductor is used for the semiconductor layer 242, heat treatment may be performed before and/or after the insulating layer 229 is formed. The heat treatment can fill oxygen vacancies in the semiconductor layer 242 by diffusing oxygen contained in the insulating layer 229 or other insulating layers into the semiconductor layer 242. Alternatively, the insulating layer 229 is formed while being heated, so that oxygen vacancies in the semiconductor layer 242 can be filled.

Figure 2:
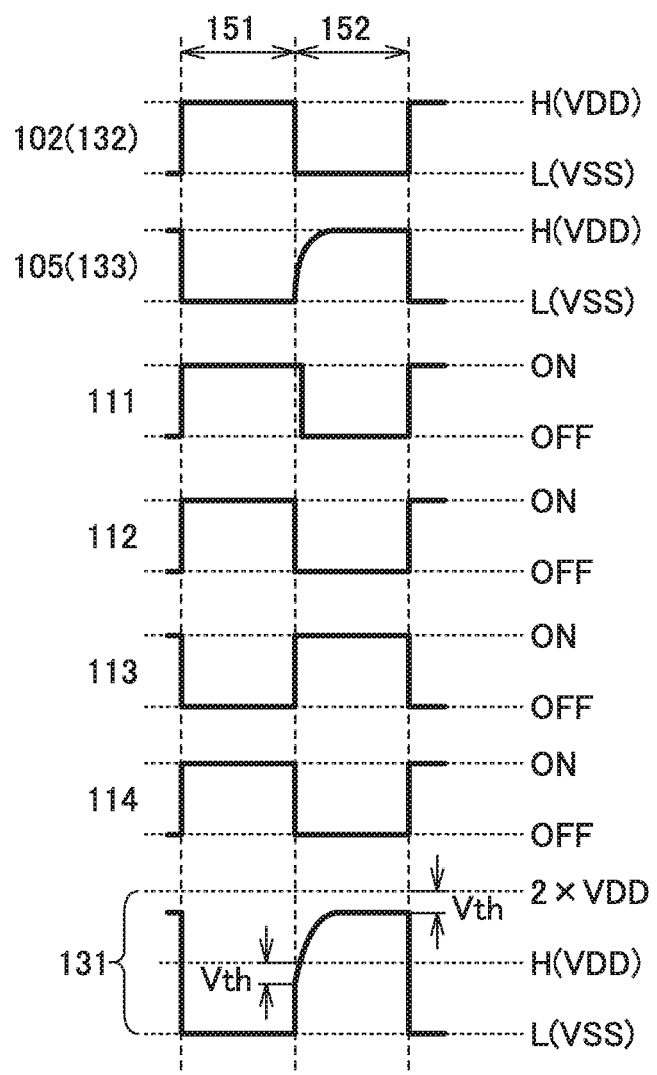
FIG. 2 is a timing chart illustrating the operation of a semiconductor device.

A transistor 411 in FIG. 10A2 is different from the transistor 410 in that an electrode 223 that can function as a back gate is provided over the insulating layer 229. The electrode 223 can be formed using a material and a method similar to those of the electrode 246.

<Back Gate>

In general, the back gate is formed using a conductive layer and positioned so that the channel formation region in the semiconductor layer is positioned between the gate and the back gate. Thus, the back gate can function like the gate. The potential of the back gate may be the same as that of the gate or may be a GND potential or a given potential. By changing the potential of the back gate independently of the potential of the gate, the threshold voltage of the transistor can be changed.

The electrode 246 and the electrode 223 can each function as a gate. Thus, the insulating layers 226, 225, 228, and 229 can each function as a gate insulating layer. The electrode 223 may be provided between the insulating layers 228 and 229.

In the case where one of the electrode 246 and the electrode 223 is simply referred to as a "gate" or "gate electrode," the other is referred to as a "back gate" or "back gate electrode." For example, in the transistor 411, in the case where the electrode 223 is referred to as a "gate electrode," the electrode 246 is referred to as a "back gate electrode." In the case where the electrode 223 is used as a "gate electrode," the transistor 411 can be regarded as a kind of top-gate transistor. Alternatively, one of the electrode 246 and the electrode 223 may be referred to as a "first gate" or "first gate electrode," and the other may be referred to as a "second gate" or "second gate electrode."

By providing the electrode 246 and the electrode 223 with the semiconductor layer 242 positioned therebetween and setting the potentials of the electrode 246 and the electrode 223 to be the same, a region of the semiconductor layer 242 through which carriers flow is enlarged in the film thickness direction; thus, the amount of transferred carriers is increased. As a result, the on-state current and field-effect mobility of the transistor 411 are increased.

Therefore, the transistor 411 has high on-state current for occupation area. That is, the area occupied by the transistor 411 can be small for required on-state current. According to one embodiment of the present invention, the area occupied by a transistor can be reduced. Therefore, according to one embodiment of the present invention, a highly integrated semiconductor device can be provided.

Furthermore, the gate and the back gate are formed using conductive layers and thus each have a function of preventing an electric field generated outside the transistor from influencing the semiconductor layer in which the channel is formed (in particular, an electric field blocking function against static electricity and the like). When the back gate is formed larger than the semiconductor layer such that the semiconductor layer is covered with the back gate, the electric field blocking function can be enhanced.

Since the electrode 246 (gate) and the electrode 223 (back gate) each have a function of blocking an electric field from the outside, electric charge of charged particles and the like generated on the insulating layer 272 side or above the electrode 223 do not influence the channel formation region in the semiconductor layer 242. Thus, degradation induced by a stress test (e.g., a negative gate bias temperature (NGBT) stress test where negative charge is applied to a gate (this stress test is also referred to as NBT or NBTS)) can be reduced. Furthermore, variation in gate voltage (rising voltage) at which on-state current starts flowing at different drain voltages can be reduced. Note that this effect is obtained when the electrodes 246 and 223 have the same potential or different potentials.

Before and after a positive GBT (PGBT) stress test where positive electric charge is applied to a gate (this stress test is also referred to as PBT or PBTS)), a transistor including a back gate has a smaller change in threshold voltage than a transistor including no back gate.

The BT stress test such as NGBT or PGBT is a kind of accelerated test and can evaluate, in a short time, a change by long-term use (i.e., a change over time) in characteristics of transistors. In particular, the amount of change in threshold voltage of the transistor before and after the BT stress test is an important indicator to examine the reliability of the transistor. As the change in the threshold voltage is smaller, the transistor has higher reliability.

By providing the electrodes 246 and 223 and setting the potentials of the electrodes 246 and 223 to be the same, the amount of change in threshold voltage is reduced. Accordingly, variation in electrical characteristics among a plurality of transistors is also reduced.

When the back gate is formed using a light-blocking conductive film, light can be prevented from entering the semiconductor layer from the back gate side. Therefore, light deterioration of the semiconductor layer can be prevented and deterioration in electrical characteristics of the transistor, such as a shift of the threshold voltage, can be prevented.

According to one embodiment of the present invention, a transistor with high reliability can be provided. Moreover, a semiconductor device with high reliability can be provided.

FIG. 10B1 is a cross-sectional view of a channel-protective transistor 420 that is a kind of bottom-gate transistor. The transistor 420 has substantially the same structure as the transistor 410 but is different from the transistor 410 in that the insulating layer 225 covers the semiconductor layer 242. With the insulating layer 225, the semiconductor layer 242 can be prevented from being exposed at the time of forming the electrodes 244a and 244b. Thus, the semiconductor layer 242 can be prevented from being reduced in thickness at the time of forming the electrodes 244a and 244b.

The semiconductor layer 242 is electrically connected to the electrode 244a in an opening formed by selectively removing part of the insulating layer 225 that overlaps with the semiconductor layer 242. The semiconductor layer 242 is electrically connected to the electrode 244b in another opening formed by selectively removing part of the insulating layer 225 that overlaps with the semiconductor layer 242. A region of the insulating layer 225 that overlaps with the channel formation region can function as a channel protective layer.

A transistor 421 in FIG. 10B2 is different from the transistor 420 in that the electrode 223 that can function as a back gate is provided over the insulating layer 229.

The distance between the electrodes 244a and 246 and the distance between the electrodes 244b and 246 in the transistors 420 and 421 are longer than those in the transistors 410 and 411. Thus, parasitic capacitance generated between the electrodes 244a and 246 can be reduced. Furthermore, parasitic capacitance generated between the electrodes 244b and 246 can be reduced. According to one embodiment of the present invention, a transistor with favorable electrical characteristics can be provided.

A transistor 425 in FIG. 10C1 is a channel-etched transistor that is a kind of bottom-gate transistor. In the transistor 425, the insulating layer 225 is not provided and the electrodes 244a and 244b are formed to be in contact with the semiconductor layer 242. Thus, part of the semiconductor layer 242 that is exposed when the electrodes 244a and 244b are formed is etched in some cases. However, since the insulating layer 225 is not provided, productivity of the transistor can be increased.

A transistor 426 in FIG. 10C2 is different from the transistor 425 in that the electrode 223 that can function as a back gate is provided over the insulating layer 229.

[Top-Gate Transistor]

FIG. 11A1 is a cross-sectional view of a transistor 430 that is a kind of top-gate transistor. The transistor 430 includes the semiconductor layer 242 over the substrate 271 with the insulating layer 272 positioned therebetween, the electrodes 244a and 244b that are over the semiconductor layer 242 and the insulating layer 272 and in contact with part of the semiconductor layer 242, the insulating layer 226 over the semiconductor layer 242 and the electrodes 244a and 244b, and the electrode 246 over the insulating layer 226.

Since the electrode 246 overlaps with neither the electrode 244a nor the electrode 244b in the transistor 430, parasitic capacitance generated between the electrodes 246 and 244a and parasitic capacitance generated between the electrodes 246 and 244b can be reduced. After the formation of the electrode 246, an impurity 255 is introduced into the semiconductor layer 242 using the electrode 246 as a mask, so that an impurity region can be formed in the semiconductor layer 242 in a self-aligned manner (see FIG. 11A3). According to one embodiment of the present invention, a transistor with favorable electrical characteristics can be provided.

The impurity 255 can be introduced with an ion implantation apparatus, an ion doping apparatus, or a plasma treatment apparatus.

As the impurity 255, for example, at least one kind of element of Group 13 elements and Group 15 elements can be used. In the case where an oxide semiconductor is used for the semiconductor layer 242, it is possible to use at least one kind of element of a rare gas, hydrogen, and nitrogen as the impurity 255.

A transistor 431 in FIG. 11A2 is different from the transistor 430 in that the electrode 223 and an insulating layer 227 are included. The transistor 431 includes the electrode 223 formed over the insulating layer 272 and the insulating layer 227 formed over the electrode 223. The electrode 223 can function as a back gate. Thus, the insulating layer 227 can function as a gate insulating layer. The insulating layer 227 can be formed using a material and a method similar to those of the insulating layer 226.

Like the transistor 411, the transistor 431 has high on-state current for occupation area. That is, the area occupied by the transistor 431 can be small for required on-state current. According to one embodiment of the present invention, the area occupied by a transistor can be reduced. Therefore, according to one embodiment of the present invention, a highly integrated semiconductor device can be provided.

A transistor 440 illustrated in FIG. 11B1 is a kind of top-gate transistor. The transistor 440 is different from the transistor 430 in that the semiconductor layer 242 is formed after the formation of the electrodes 244a and 244b. A transistor 441 illustrated in FIG. 11B2 is different from the transistor 440 in that the electrode 223 and the insulating layer 227 are included. Thus, in the transistors 440 and 441, part of the semiconductor layer 242 is formed over the electrode 244a and another part of the semiconductor layer 242 is formed over the electrode 244b.

Like the transistor 411, the transistor 441 has high on-state current for occupation area. That is, the area occupied by the transistor 441 can be small for required on-state current. According to one embodiment of the present invention, the area occupied by a transistor can be reduced. Therefore, according to one embodiment of the present invention, a highly integrated semiconductor device can be provided. The transistor 441 as well as the transistor 411 has a high on-state current for the area occupied thereby. That is, the area occupied by the transistor 441 can be small for required on-state current. With one embodiment of the present invention, the area occupied by a transistor can be reduced. Therefore, with one embodiment of the present invention, a semiconductor device having a high degree of integration can be provided.

A transistor 442 illustrated in FIG. 12A1 is a kind of top-gate transistor. The transistor 442 includes the electrodes 244a and 244b over the insulating layer 229. The electrodes 244a and 244b are electrically connected to the semiconductor layer 242 in openings formed in the insulating layers 228 and 229.

Part of the insulating layer 226 that does not overlap with the electrode 246 is removed. The insulating layer 226 included in the transistor 442 is partly extended across the ends of the electrode 246.

The impurity 255 is added to the semiconductor layer 242 using the electrode 246 and the insulating layer 226 as masks, so that an impurity region can be formed in the semiconductor layer 242 in a self-aligned manner (see FIG. 12A3).

At this time, the impurity 255 is not added to the semiconductor layer 242 in a region that overlaps with the electrode 246, and the impurity 255 is added to the semiconductor layer 242 in a region that does not overlap with the electrode 246. The semiconductor layer 242 in a region to which the impurity 255 is added through the insulating layer 226 has a lower impurity concentration than the semiconductor layer 242 in a region to which the impurity 255 is added without the insulating layer 226. Thus, a lightly doped drain (LDD) region is formed in the semiconductor layer 242 in a region adjacent to the electrode 246.

A transistor 443 in FIG. 12A2 is different from the transistor 442 in that the electrode 223 is provided below the semiconductor layer 242. The electrode 223 and the semiconductor layer 242 overlap with each other with the insulating layer 272 positioned therebetween. The electrode 223 can function as a back gate electrode.

As in a transistor 444 in FIG. 12B1 and a transistor 445 in FIG. 12B2, the insulating layer 226 in a region that does not overlap with the electrode 246 may be wholly removed. Alternatively, as in a transistor 446 in FIG. 12C1 and a transistor 447 in FIG. 12C2, the insulating layer 226 except for the openings may be left without being removed.

In the transistors 444 to 447, after the formation of the electrode 246, the impurity 255 is added to the semiconductor layer 242 using the electrode 246 as a mask, so that an impurity region can be formed in the semiconductor layer 242 in a self-aligned manner.

[S-Channel Transistor]

FIGS. 13A to 13C illustrate an example of the structure of a transistor using an oxide semiconductor for the semiconductor layer 242. In a transistor 450 illustrated in FIGS. 13A to 13C, a semiconductor layer 242b is formed over a semiconductor layer 242a, and a semiconductor layer 242c covers a top surface and a side surface of the semiconductor layer 242b and a side surface of the semiconductor layer 242a. FIG. 13A is a top view of the transistor 450. FIG. 13B is a cross-sectional view (in the channel length direction) taken along dashed-dotted line X1-X2 in FIG. 13A. FIG. 13C is a cross-sectional view (in the channel width direction) taken along dashed-dotted line Y1-Y2 in FIG. 13A.

The transistor 450 includes an electrode 243 functioning as a gate electrode. The electrode 243 can be formed using a material and a method similar to those of the electrode 246. The electrode 243 is formed using two stacked conductive layers in this embodiment.

Each of the semiconductor layer 242a, the semiconductor layer 242b, and the semiconductor layer 242c is formed using a material containing either In or Ga or both of them. Typical examples are an In—Ga oxide (an oxide containing In and Ga), an In—Zn oxide (an oxide containing In and Zn), and an In-M-Zn oxide (an oxide containing In, an element M, and Zn, where the element M is one or more kinds of elements selected from Al, Ti, Ga, Y, Zr, La, Ce, Nd, or Hf and has a higher strength of bonding with oxygen than In has).

The semiconductor layer 242a and the semiconductor layer 242c are preferably formed using a material containing one or more kinds of metal elements contained in the semiconductor layer 242b. With such a material, interface states at interfaces between the semiconductor layer 242a and the semiconductor layer 242b and between the semiconductor layer 242c and the semiconductor layer 242b are less likely to be generated. Accordingly, carriers are less likely to be scattered or captured at the interfaces, which results in an improvement in field-effect mobility of the transistor. Furthermore, variation in the threshold voltage of the transistor can be reduced. Thus, a semiconductor device having favorable electrical characteristics can be obtained.

Each of the thicknesses of the semiconductor layer 242a and the semiconductor layer 242c is greater than or equal to 3 nm and less than or equal to 100 nm, preferably greater than or equal to 3 nm and less than or equal to 50 nm. The thickness of the semiconductor layer 242b is greater than or equal to 3 nm and less than or equal to 200 nm, preferably greater than or equal to 3 nm and less than or equal to 100 nm, more preferably greater than or equal to 3 nm and less than or equal to 50 nm.

In the case where the semiconductor layer 242b is an In-M-Zn oxide and the semiconductor layers 242a and 242c are each an In-M-Zn oxide, the semiconductor layers 242a and 242c each have an atomic ratio of In:M:Zn=$x_1$:$y_1$:$z_1$, and the semiconductor layer 242b has an atomic ratio of In:M:Zn=$x_2$:$y_2$:$z_2$. In that case, the compositions of the semiconductor layers 242a, 242c, and 242b can be determined so that $y_1/x_1$ is larger than $y_2/x_2$. It is preferable that the compositions of the semiconductor layers 242a, 242c, and 242b are determined so that $y_1/x_1$ is 1.5 times or more as large as $y_2/x_2$. It is further preferable that the compositions of the semiconductor layers 242a, 242c, and 242b are determined so that $y_1/x_1$ is twice or more as large as $y_2/x_2$. It is still further preferable that the semiconductor layers 242a, 242c, and 242b are determined so that $y_1/x_1$ is three times or more as large as $y_2/x_2$. It is preferable that $y_1$ be larger than or equal to $x_1$ because the transistor can have stable electrical characteristics. However, when $y_1$ is three times or more as large as $x_1$, the field-effect mobility of the transistor is decreased; accordingly, $y_1$ is preferably smaller than three times $x_1$. When the semiconductor layers 242a and 242c have the above compositions, the semiconductor layers 242a and 242c can each be a layer in which oxygen vacancies are less likely to be generated than in the semiconductor layer 242b.

In the case where the semiconductor layers 242a and 242c are each an In-M-Zn oxide and the summation of In and the element M is assumed to be 100 atomic %, the atomic percentages of In and the element M are preferably as follows: the percentage of In is lower than 50 atomic % and the percentage of M is higher than or equal to 50 atomic %. The percentages of In and M are more preferably as follows: the percentage of In is lower than 25 atomic % and the percentage of M is higher than or equal to 75 atomic %. In the case where the semiconductor layer 242b is an In-M-Zn oxide and the summation of In and M is assumed to be 100 atomic %, the atomic percentages of In and the element M are preferably more than or equal to 25 atomic % and less than 75 atomic %, respectively, more preferably more than or equal to 34 atomic % and less than 66 atomic %, respectively.

For example, an In—Ga—Zn oxide that is formed using a target having an atomic ratio of In:Ga:Zn=1:3:2, 1:3:4, 1:3:6, 1:4:5, 1:6:4, or 1:9:6, an In—Ga oxide that is formed using a target having an atomic ratio of In:Ga=1:9, gallium oxide, or the like can be used for each of the semiconductor layers 242a and 242c containing In or Ga. Furthermore, an In—Ga—Zn oxide that is formed using a target having an atomic ratio of In:Ga:Zn=3:1:2, 1:1:1, 5:5:6, 5:1:7, or 4:2:4.1 can be used for the semiconductor layer 242b. Note that the atomic ratio of each of the semiconductor layers 242a, 242b, and 242c may vary within a range of ±20% of any of the above atomic ratios as an error.

In order to give stable electrical characteristics to the transistor including the semiconductor layer 242b, it is preferable that impurities and oxygen vacancies in the semiconductor layer 242b be reduced to highly purify the semiconductor layer so that the semiconductor layer 242b can be a highly-purified intrinsic or substantially highly-purified intrinsic semiconductor layer. Furthermore, it is preferable that at least the channel formation region in the semiconductor layer 242b be a semiconductor layer that can be regarded as a highly-purified intrinsic or substantially highly-purified intrinsic semiconductor layer.

Note that the substantially highly-purified intrinsic oxide semiconductor layer refers to an oxide semiconductor layer in which carrier density is higher than or equal to $1\times10^{-9}/cm^3$ and lower than $8\times10^{11}/cm^3$, preferably lower than $1\times10^{11}/cm^3$, more preferably lower than $1\times10^{10}/cm^3$.

Figure 14A:
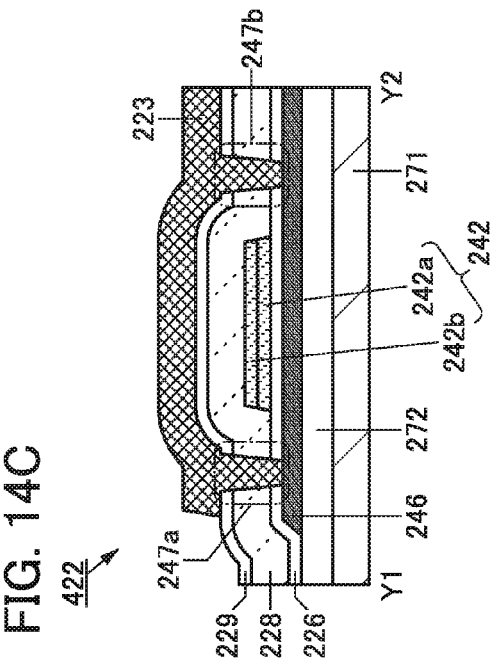
FIGS. 14A to 14C each illustrates a structure example of a transistor.
Figure 14C:
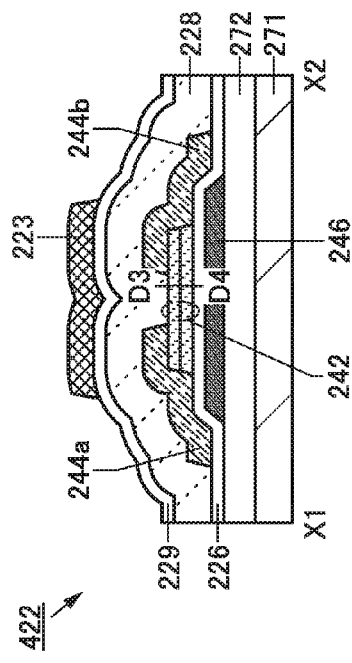
Figure 14B:
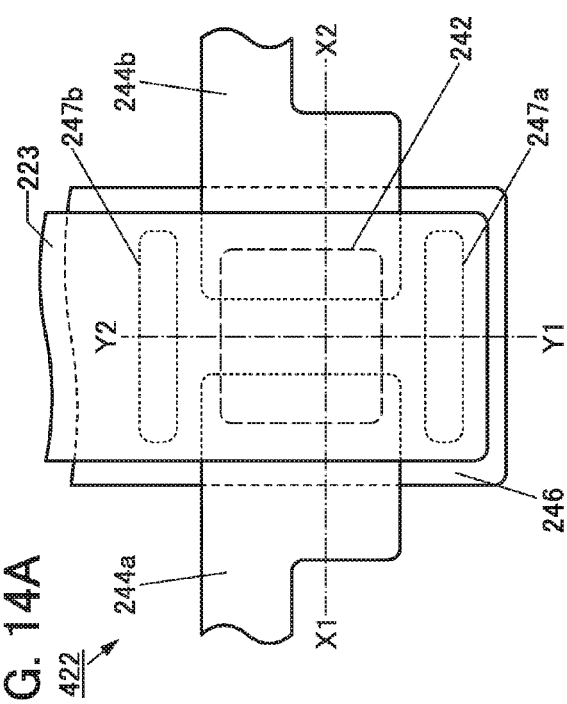

FIGS. 14A to 14C illustrate an example of the structure of a transistor using an oxide semiconductor for the semiconductor layer 242. In a transistor 422 illustrated in FIGS. 14A to 14C, the semiconductor layer 242b is formed over the semiconductor layer 242a. The transistor 422 is a kind of bottom-gate transistor having a back gate. FIG. 14A is a top view of the transistor 422. FIG. 14B is a cross-sectional view (in the channel length direction) taken along dashed-dotted line X1-X2 in FIG. 14A. FIG. 14C is a cross-sectional view (in the channel width direction) taken along dash-dot line Y1-Y2 in FIG. 14A.

The electrode 223 provided over the insulating layer 229 is electrically connected to the electrode 246 in an opening 247a and an opening 247b provided in the insulating layers 226, 228, and 229. Thus, the same potential is applied to the electrodes 223 and 246. Furthermore, either or both of the openings 247a and 247b may be omitted. In the case where neither the opening 247a nor the opening 247b are provided, different potentials can be applied to the electrodes 223 and 246.

[Energy Band Structure of Oxide Semiconductor]

Figure 20A:
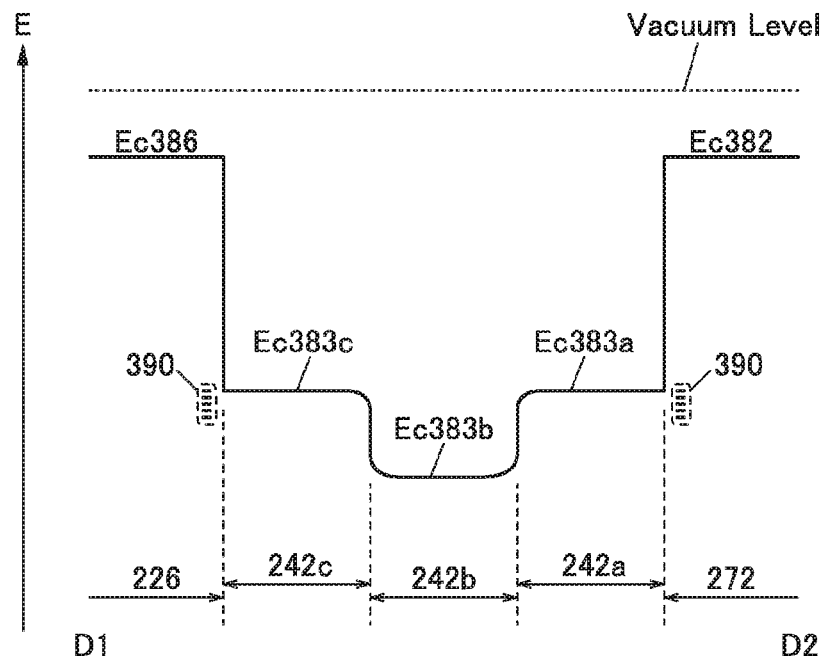
FIGS. 20A and 20B show energy band structures.
Figure 20B:
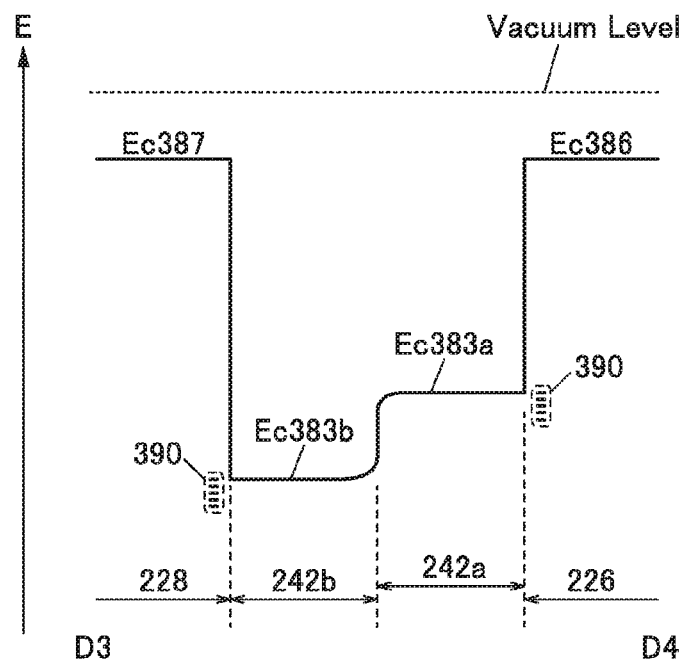

Here, the function and effect of the semiconductor layer 242 that is a stacked layer including the semiconductor layers 242a, 242b, and 242c are described with energy band structure diagrams shown in FIGS. 20A and 20B. FIG. 20A is the energy band structure diagram of a portion along dashed-dotted line D1-D2 in FIG. 13B. That is, FIG. 20A shows the energy band structure of a channel formation region of the transistor 450.

In FIG. 20A, Ec382, Ec383a, Ec383b, Ec383c, and Ec386 indicate the energy of the conduction band minimum of the insulating layer 272, the semiconductor layer 242a, the semiconductor layer 242b, the semiconductor layer 242c, and the insulating layer 226, respectively.

Here, a difference in energy between the vacuum level and the conduction band minimum (the difference is also referred to as electron affinity) corresponds to a value obtained by subtracting an energy gap from a difference in energy between the vacuum level and the valence band maximum (the difference is also referred to as an ionization potential). Note that the energy gap can be measured using a spectroscopic ellipsometer (e.g., UT-300 manufactured by HORIBA JOBIN YVON S.A.S.). The difference in energy between the vacuum level and the valence band maximum can be measured using an ultraviolet photoelectron spectroscopy (UPS) device (e.g., VersaProbe manufactured by ULVAC-PHI, Inc.).

Note that an In—Ga—Zn oxide that is formed using a target having an atomic ratio of In:Ga:Zn=1:3:2 has an energy gap of approximately 3.5 eV and an electron affinity of approximately 4.5 eV. An In—Ga—Zn oxide that is formed using a target having an atomic ratio of In:Ga:Zn=1:3:4 has an energy gap of approximately 3.4 eV and an electron affinity of approximately 4.5 eV. An In—Ga—Zn oxide that is formed using a target having an atomic ratio of In:Ga:Zn=1:3:6 has an energy gap of approximately 3.3 eV and an electron affinity of approximately 4.5 eV. An In—Ga—Zn oxide that is formed using a target having an atomic ratio of In:Ga:Zn=1:6:2 has an energy gap of approximately 3.9 eV and an electron affinity of approximately 4.3 eV. An In—Ga—Zn oxide that is formed using a target having an atomic ratio of In:Ga:Zn=1:6:8 has an energy gap of approximately 3.5 eV and an electron affinity of approximately 4.4 eV. An In—Ga—Zn oxide that is formed using a target having an atomic ratio of In:Ga:Zn=1:6:10 has an energy gap of approximately 3.5 eV and an electron affinity of approximately 4.5 eV. An In—Ga—Zn oxide that is formed using a target having an atomic ratio of In:Ga:Zn=1:1:1 has an energy gap of approximately 3.2 eV and an electron affinity of approximately 4.7 eV. An In—Ga—Zn oxide that is formed using a target having an atomic ratio of In:Ga:Zn=3:1:2 has an energy gap of approximately 2.8 eV and an electron affinity of approximately 5.0 eV.

Since the insulating layer 272 and the insulating layer 226 are insulators, Ec382 and Ec386 are closer to the vacuum level (have smaller electron affinity) than Ec383a, Ec383b, and Ec383c.

Furthermore, Ec383a is closer to the vacuum level than Ec383b. Specifically, Ec383a is preferably located closer to the vacuum level than Ec383b by 0.05 eV or more, 0.07 eV or more, 0.1 eV or more, or 0.15 eV or more and 2 eV or less, 1 eV or less, 0.5 eV or less, or 0.4 eV or less.

Furthermore, Ec383c is closer to the vacuum level than Ec383b. Specifically, Ec383c is preferably located closer to the vacuum level than Ec383b by 0.05 eV or more, 0.07 eV or more, 0.1 eV or more, or 0.15 eV or more and 2 eV or less, 1 eV or less, 0.5 eV or less, or 0.4 eV or less.

In the vicinity of an interface between the semiconductor layer 242a and the semiconductor layer 242b and the vicinity of an interface between the semiconductor layer 242b and the semiconductor layer 242c, mixed regions are formed; thus, the energy of the conduction band minimum continuously changes. In other words, no state or few states exist at these interfaces.

Accordingly, electrons transfer mainly through the semiconductor layer 242b in the layered structure having the above energy band structure. Therefore, even when states exist at the interface between the semiconductor layer 242a and the insulating layer 272 or at the interface between the semiconductor layer 242c and the insulating layer 226, the states hardly influence transfer of electrons. In addition, states do not exist or hardly exist at the interface between the semiconductor layer 242a and the semiconductor layer 242b and at the interface between the semiconductor layer 242c and the semiconductor layer 242b; thus, transfer of electrons are not prohibited in the regions. Accordingly, high field-effect mobility can be obtained in the transistor having the above layered structure of the oxide semiconductors.

Note that although trap states 390 due to impurities or defects might be formed in the vicinity of the interface between the semiconductor layer 242a and the insulating layer 272 and in the vicinity of the interface between the semiconductor layer 242c and the insulating layer 226 as shown in FIG. 20A, the semiconductor layer 242b can be apart from the trap states owing to the existence of the semiconductor layer 242a and the semiconductor layer 242c.

In particular, in the transistor 450 described in this embodiment, an upper surface and a side surface of the semiconductor layer 242b are in contact with the semiconductor layer 242c, and a bottom surface of the semiconductor layer 242b is in contact with the semiconductor layer 242a. In this manner, the semiconductor layer 242b is surrounded by the semiconductor layer 242a and the semiconductor layer 242c, so that the influence of the trap state can be further reduced.

However, in the case where an energy difference between Ec383a or Ec383c and Ec383b is small, electrons in the semiconductor layer 242b might reach the trap states by passing over the energy gap. The electrons are trapped by the trap states, which generates a negative fixed charge at the interface with the insulating layer, causing the threshold voltage of the transistor to be shifted in a positive direction.

Therefore, each of the energy differences between Ec383a and Ec383b and between Ec383c and Ec383b is preferably set to be larger than or equal to 0.1 eV, more preferably larger than or equal to 0.15 eV because a change in the threshold voltage of the transistor can be reduced and the transistor can have favorable electrical characteristics.

Each of the band gaps of the semiconductor layers 242a and 242c is preferably larger than that of the semiconductor layer 242b.

FIG. 20B is the energy band structure diagram of a portion along dashed-dotted line D3-D4 in FIG. 14B. FIG. 20B shows the energy band structure of a channel formation region of the transistor 422.

In FIG. 20B, Ec387 represents the energy of the conduction band minimum of the insulating layer 228. The semiconductor layer 242 is formed using two layers, the semiconductor layers 242a and 242b; thus, the transistor can be manufactured with improved productivity. Since the semiconductor layer 242c is not provided, the transistor including the two semiconductor layers is easily affected by the trap states 390 but can have higher field-effect mobility than a transistor including one semiconductor layer as the semiconductor layer 242.

According to one embodiment of the present invention, a transistor with a small variation in electrical characteristics can be provided. Accordingly, a semiconductor device with a small variation in electrical characteristics can be provided. According to one embodiment of the present invention, a transistor with high reliability can be provided. Accordingly, a semiconductor device with high reliability can be provided.

Note that an oxide semiconductor has an energy gap as wide as 2 eV or more and high visible-light transmittance. In a transistor obtained by processing an oxide semiconductor under appropriate conditions, the off-state current at ambient temperature (e.g., 25° C.) can be less than or equal to 100 zA ($1 \times 10^{-19}$ A), less than or equal to 10 zA ($1 \times 10^{-20}$ A), or less than or equal to 1 zA ($1 \times 10^{-21}$ A). Therefore, a low-power semiconductor device can be provided.

According to one embodiment of the present invention, a low-power transistor can be provided. Accordingly, a display element or a semiconductor device such as a display device with low power consumption can be provided. Moreover, a display element or a semiconductor device such as a display device with high reliability can be provided.

The transistor 450 in FIGS. 13A to 13C is described again. The semiconductor layer 242b is provided over a projecting portion of the insulating layer 272, so that the electrode 243 can also cover a side surface of the semiconductor layer 242b. Thus, the transistor 450 has a structure in which the semiconductor layer 242b can be electrically surrounded by the electric field of the electrode 243. The structure of a transistor in which a semiconductor layer including a channel is electrically surrounded by the electric field of a conductive film in this manner is called a surrounded channel (s-channel) structure. A transistor having an s-channel structure is referred to as an s-channel transistor.

In the s-channel structure, a channel can be formed in the whole (bulk) of the semiconductor layer 242b. In the s-channel structure, the drain current of the transistor is increased, so that higher on-state current can be obtained. Furthermore, the entire channel formation region of the semiconductor layer 242b can be depleted by the electric field of the electrode 243. Accordingly, the off-state current of the transistor with an s-channel structure can be further reduced.

When the projecting portion of the insulating layer 272 is increased in height and the channel width is shortened, the effects of the s-channel structure to increase the on-state current and reduce the off-state current can be enhanced. Part of the semiconductor layer 242a exposed in the formation of the semiconductor layer 242b may be removed. In that case, the side surfaces of the semiconductor layer 242a and 242b may be aligned to each other.

As in a transistor 451 in FIGS. 15A to 15C, the electrode 223 may be provided below the semiconductor layer 242 with an insulating layer positioned therebetween. FIG. 15A is a top view of the transistor 451. FIG. 15B is a cross-sectional view taken along dashed-dotted line X1-X2 in FIG. 15A. FIG. 15C is a cross-sectional view taken along dashed-dotted line Y1-Y2 in FIG. 15A.

Figure 16A:
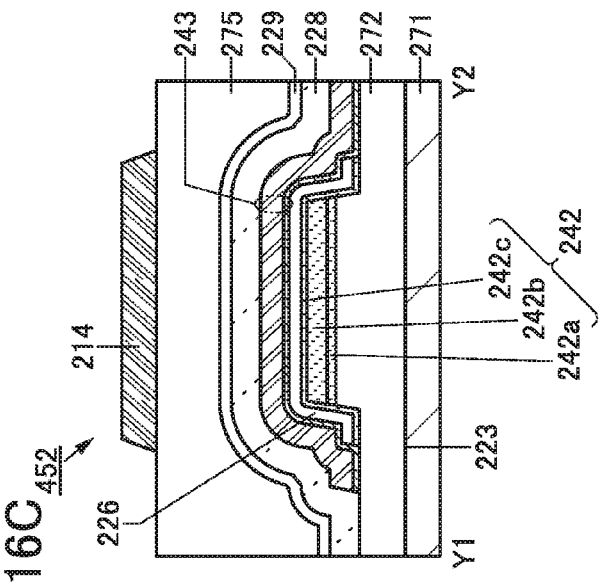
FIGS. 16A to 16C each illustrates a structure example of a transistor.
Figure 16B:
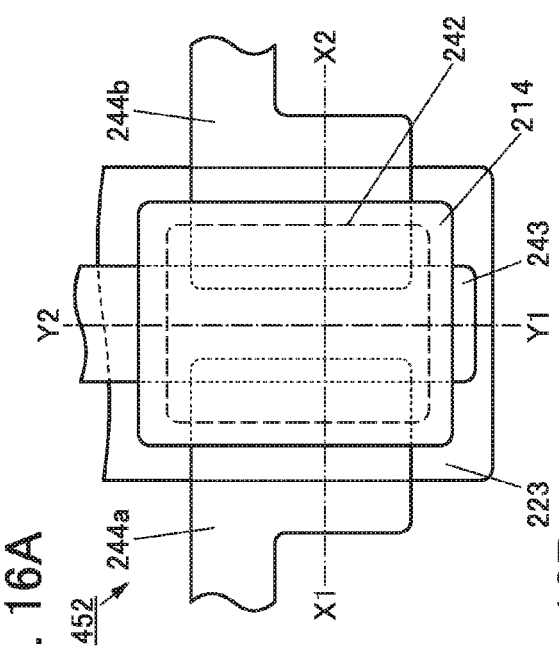
Figure 16C:
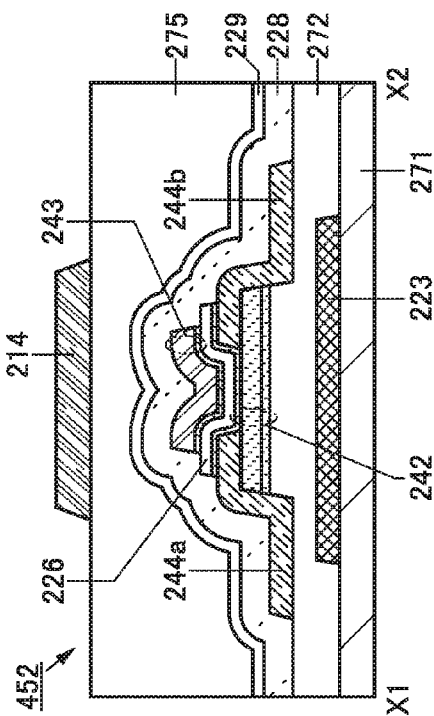

As in a transistor 452 in FIGS. 16A to 16C, an insulating layer 275 may be provided above the electrode 243 and a layer 214 may be provided over the insulating layer 275. FIG. 16A is a top view of the transistor 452. FIG. 16B is a cross-sectional view taken along dashed-dotted line X1-X2 in FIG. 16A. FIG. 16C is a cross-sectional view taken along dashed-dotted line Y1-Y2 in FIG. 16A.

Although the layer 214 is provided over the insulating layer 275 in FIGS. 16A to 16C, the layer 214 may be provided over the insulating layer 228 or 229. When the layer 214 is formed using a light-blocking material, the change in characteristics or decrease in reliability of the transistor that is caused by light irradiation can be prevented. When the layer 214 is formed at least larger than the semiconductor layer 242b such that the semiconductor layer 242b is covered with the layer 214, the above effects can be enhanced. The layer 214 can be formed using an organic material, an inorganic material, or a metal material. In the case where the layer 214 is formed using a conductive material, the layer 214 may be supplied with voltage or may be set to an electrically floating state.

Figure 17A:
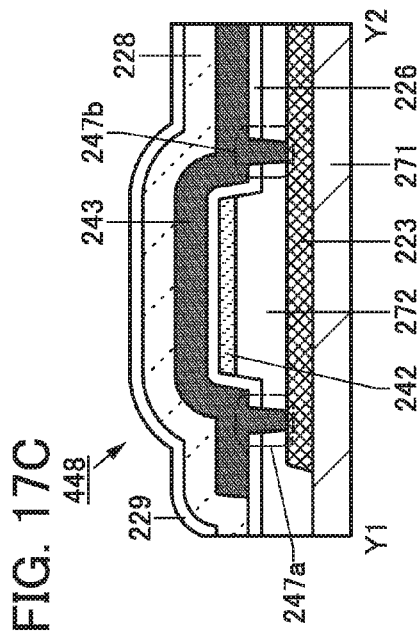
FIGS. 17A to 17C each illustrates a structure example of a transistor.
Figure 17B:
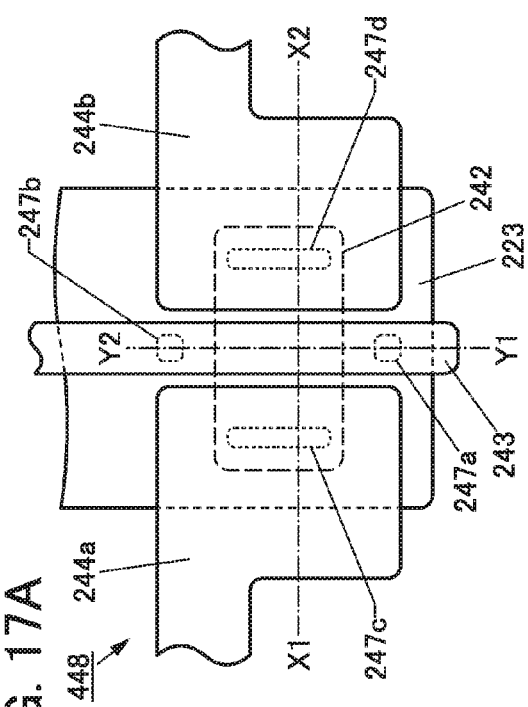
Figure 17C:
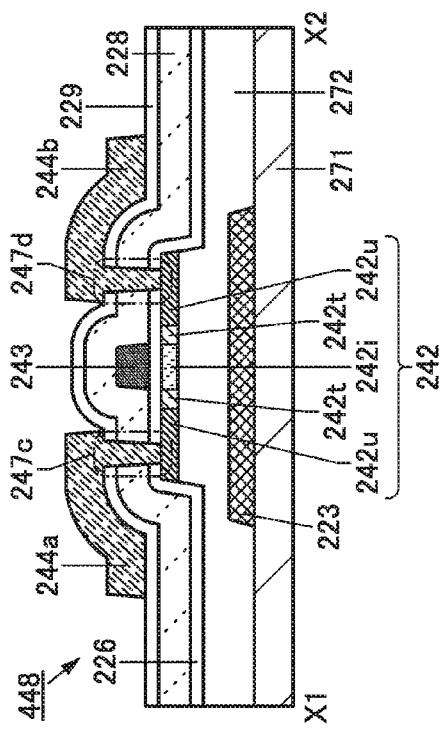

FIGS. 17A to 17C illustrate an example of a transistor with an s-channel structure. A transistor 448 illustrated in FIGS. 17A to 17C has almost the same structure as the transistor 447. In the transistor 448, the semiconductor layer 242 is formed over the projecting portion of the insulating layer 272. The transistor 448 is a kind of top-gate transistor having a back gate electrode. FIG. 17A is a top view of the transistor 448. FIG. 17B is a cross-sectional view taken along dashed-dotted line X1-X2 in FIG. 17A. FIG. 17C is a cross-sectional view taken along dashed-dotted line Y1-Y2 in FIG. 17A.

FIGS. 17A to 17C illustrate an example in which an inorganic semiconductor layer such as a silicon layer is used as the semiconductor layer 242 in the transistor 448. In FIGS. 17A to 17C, the semiconductor layer 242 includes a semiconductor layer 242i in a region overlapping with the gate electrode 246, two semiconductor layers 242t, and two semiconductor layers 242u. The semiconductor layer 242i is positioned between the two semiconductor layers 242t. The semiconductor layer 242i and the two semiconductor layers 242t are positioned between the two semiconductor layers 242u.

A channel is formed in the semiconductor layer 242i when the transistor 448 is on. Therefore, the semiconductor layer 242i serves as a channel formation region. The semiconductor layers 242t serve as low concentration impurity regions (i.e., LDD). The semiconductor layers 242u serve as high concentration impurity regions. Note that one or both of the two semiconductor layers 242t are not necessarily provided. One of the two semiconductor layers 242u serves as a source region, and the other semiconductor layer 242u serves as a drain region.

The electrode 244a provided over the insulating layer 229 is electrically connected to one of the semiconductor layers 242u in an opening 247c formed in the insulating layers 226, 228, and 229. The electrode 244b provided over the insulating layer 229 is electrically connected to the other of the semiconductor layers 242u in an opening 247d formed in the insulating layers 226, 228, and 229.

The electrode 243 provided over the insulating layer 226 is electrically connected to the electrode 223 in an opening 247a and an opening 247b formed in the insulating layers 226 and 272. Accordingly, the same potential is applied to the electrodes 223 and 243. Either or both of the openings 247a and 247b may be omitted. In the case where neither the opening 247a nor the opening 247b are provided, different potentials can be applied to the electrodes 223 and 243.

Figure 18A:
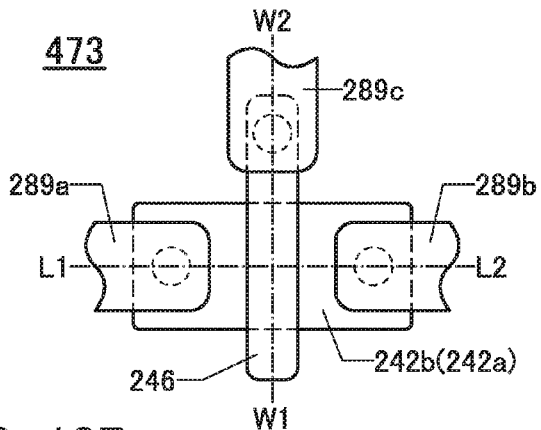
FIGS. 18A and 18B each illustrates a structure example of a transistor.
Figure 18B:
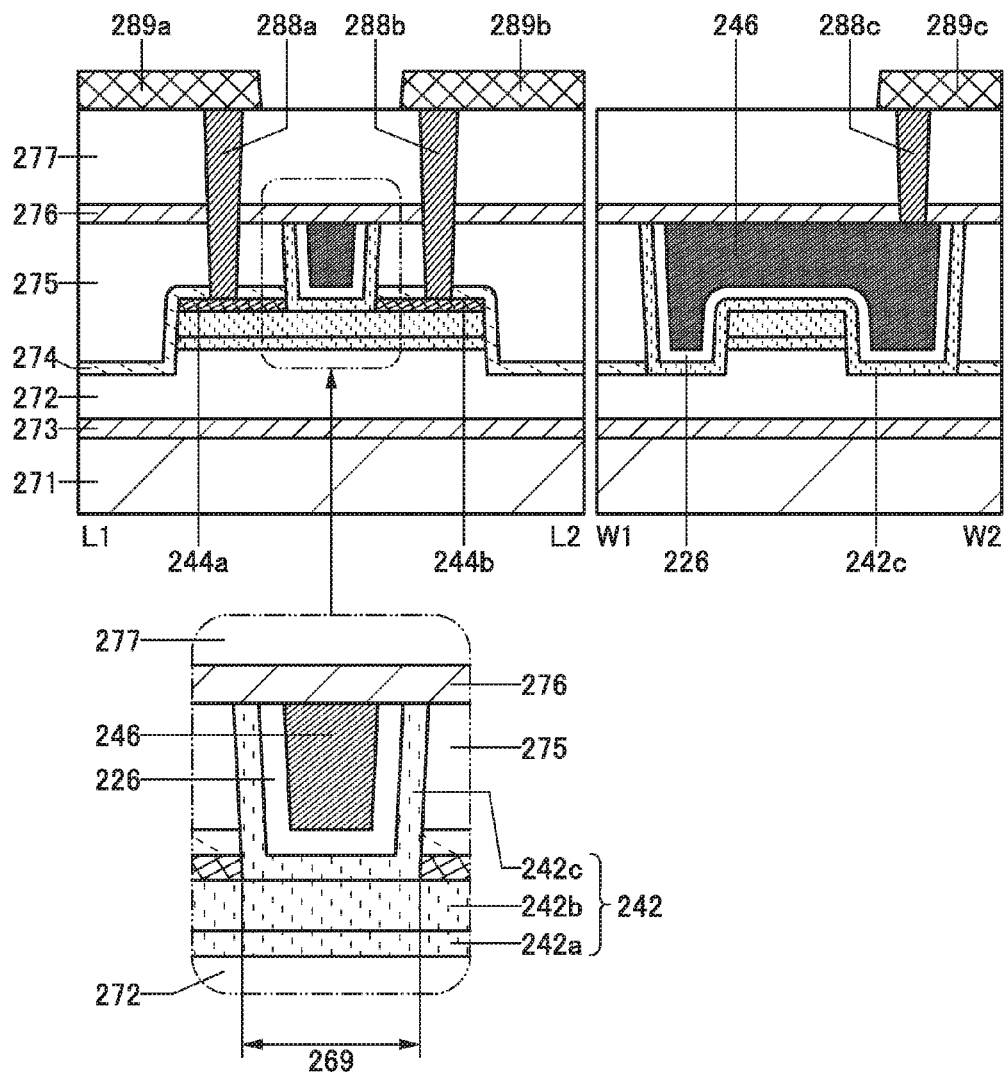

FIGS. 18A and 18B illustrate another example of an s-channel transistor. FIG. 18A is a plan view of a transistor 473. FIG. 18B illustrates a cross-sectional view taken along dashed-dotted line L1-L2 and a cross-sectional view taken along dashed-dotted line W1-W2 in FIG. 18A. In FIG. 18B, the cross-sectional view along L1-L2 is taken in the channel length direction of the transistor 473 and the cross-sectional view along W1-W2 is taken in the channel width direction of the transistor 473.

The transistor 473 includes the semiconductor layer 242, the insulating layer 226, the electrode 246, and the electrodes 244a and 244b. The electrode 246 can function as a gate electrode. The insulating layer 226 can function as a gate insulating layer. The electrode 244a can function as one of a source electrode and a drain electrode. The electrode 244b can function as the other of the source electrode and the drain electrode. The transistor 473 is provided over the substrate 271 with the insulating layer 272 and an insulating layer 273 positioned therebetween.

In FIG. 18B, the insulating layer 273 is provided over the substrate 271, and the insulating layer 272 is provided over the insulating layer 273. The insulating layer 272 has a projecting portion, and island-shaped semiconductor layers 242a and 242b are formed over the projecting portion. The electrodes 244a and 244b are provided over the semiconductor layer 242b. A region of the semiconductor layer 242b that overlaps with the electrode 244a can function as one of a source and a drain of the transistor 473. A region of the semiconductor layer 242b that overlaps with the electrode 244b can function as the other of the source and the drain of the transistor 473. Thus, a region 269 of the semiconductor layer 242b that is located between the electrodes 244a and 244b can function as a channel formation region.

An oxide semiconductor layer 274 is provided over the electrodes 244a and 244b, and an insulating layer 275 is provided over the oxide semiconductor layer 274. An opening is provided in regions of the oxide semiconductor layer 274 and the insulating layer 275 that overlap with the region 269, and the semiconductor layer 242c is provided along the side and bottom surfaces of the opening. In the opening, the insulating layer 226 is provided along the side and bottom surfaces of the opening with the oxide semiconductor layer 242c positioned therebetween. In the opening, the electrode 246 is provided along the side and bottom surfaces of the opening with the semiconductor layer 242c and the insulating layer 226 positioned therebetween.

Note that the opening is wider than the semiconductor layer 242a and the semiconductor layer 242b in the cross section in the channel width direction. Accordingly, the side surfaces of the semiconductor layer 242a and the semiconductor layer 242b in the region 269 are covered with the semiconductor layer 242c. The side surfaces of the semiconductor layer 242a and the semiconductor layer 242b in regions other than the region 269 are covered with the oxide semiconductor layer 274.

An insulating layer 276 is provided over the insulating layer 275, and an insulating layer 277 is provided over the insulating layer 276. Electrodes 289a, 289b, and 289c are provided over the insulating layer 277. The electrode 289a is electrically connected to the electrode 244a through a contact plug 288a in an opening obtained by removing parts of the insulating layer 277, the insulating layer 276, the insulating layer 275, and the oxide semiconductor layer 274. The electrode 289b is electrically connected to the electrode 244b through a contact plug 288b in an opening obtained by removing parts of the insulating layer 277, the insulating layer 276, the insulating layer 275, and the oxide semiconductor layer 274. The electrode 289c is electrically connected to the electrode 246 through a contact plug 288c in an opening obtained by removing parts of the insulating layer 277 and the insulating layer 276.

As illustrated in FIG. 18B, in the transistor 473 in the channel width direction, the electrode 246 covers the semiconductor layer 242b. When the insulating layer 272 has the projecting portion, the side surfaces of the semiconductor layer 242b can be covered with the electrode 246.

Figure 19A:
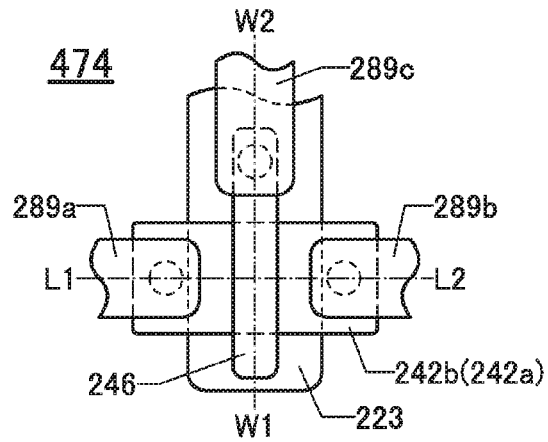
FIGS. 19A to 19C each illustrates a structure example of a transistor.
Figure 19B:
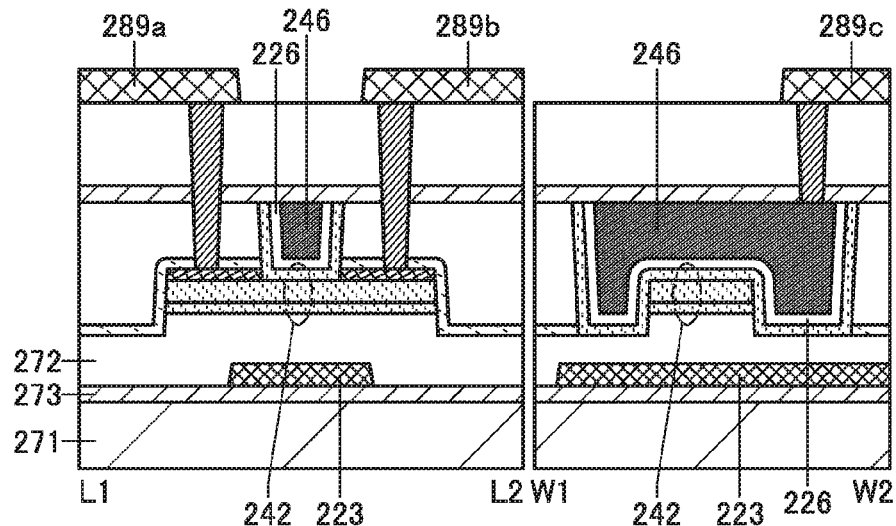

A transistor 474 in FIGS. 19A and 19B is different from the transistor 473 in that the electrode 223 functioning as a back gate electrode is provided between the insulating layers 272 and 273. FIG. 19A is a plan view of the transistor 474. FIG. 19B illustrates a cross-sectional view taken along dashed-dotted line L1-L2 and a cross-sectional view taken along dashed-dotted line W1-W2 in FIG. 19A. Note that the electrode 223 may be provided between the substrate 271 and the insulating layer 273.

The electrode 246 and the electrode 223 can each function as a gate electrode. Thus, the insulating layers 272 and 226 can each function as a gate insulating layer.

By providing the electrode 246 and the electrode 223 with the semiconductor layer 242 positioned therebetween and setting the potentials of the electrode 246 and the electrode 223 to be the same, a region of the semiconductor layer 242 through which carriers flow is enlarged in the film thickness direction; thus, the amount of transferred carriers is increased. As a result, the on-state current and field-effect mobility of the transistor 474 are increased.

Figure 19C:
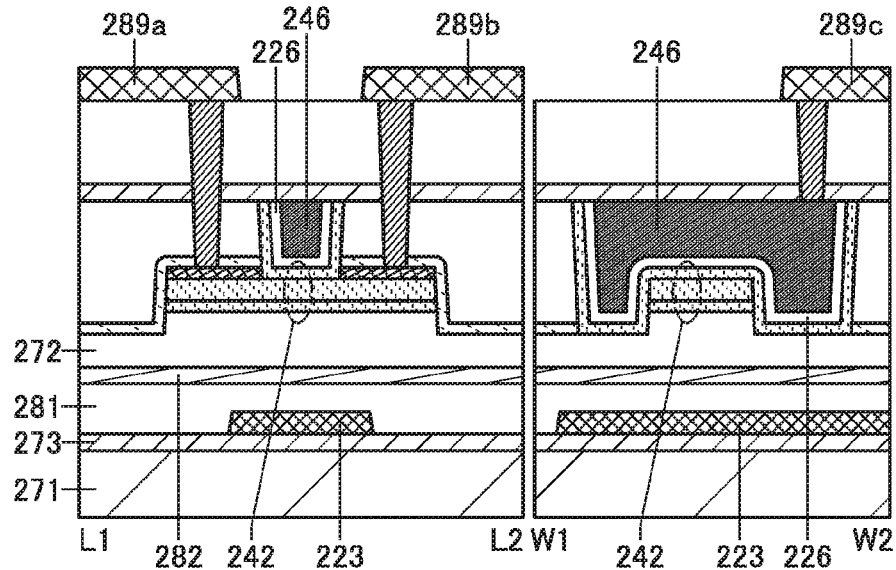

Furthermore, for example, as illustrated in FIG. 19C, the insulating layer 281 may be formed over the electrode 223, the insulating layer 282 may be formed over the insulating layer 281, and the insulating layer 272 may be formed over the insulating layer 282. The insulating layers 281 and 282 can be formed using a material and a method similar to those of the insulating layer 272.

Note that when the insulating layer 282 is formed using hafnium oxide, aluminum oxide, tantalum oxide, aluminum silicate, or the like, the insulating layer 282 can function as a charge trap layer. The threshold voltage of the transistor can be changed by injecting electrons into the insulating layer 282. For example, electrons may be injected into the insulating layer 282 with the use of the tunnel effect. By applying positive voltage to the electrode 223, tunnel electrons can be injected into the insulating layer 282.

<Deposition Method>

Conductive layers, insulating layers, and semiconductor layers used for electrodes and the like described in this specification and the like can be formed by CVD, vapor deposition, sputtering, or the like. CVD can be typically classified into plasma-enhanced CVD (PECVD) using plasma, thermal CVD (TCVD) using heat, and the like. CVD can be further classified into metal CVD (MCVD) and metal organic CVD (MOCVD) according to a source gas to be used.

Furthermore, the vapor deposition can be typically classified into resistance heating vapor deposition, electron beam vapor deposition, molecular beam epitaxy (MBE), pulsed laser deposition (PLD), ion beam assisted deposition (IAD), atomic layer deposition (ALD), and the like.

A high-quality film can be formed by PECVD at a relatively low temperature. By using a deposition method that does not use plasma for deposition, such as MOCVD or vapor deposition, a film can be formed with few defects because damage is not easily caused on a surface on which the film is formed.

Sputtering can be typically classified into DC sputtering, magnetron sputtering, RF sputtering, ion beam sputtering, electron cyclotron resonance (ECR) sputtering, facing-target sputtering, and the like.

In facing-target sputtering, plasma is confined between targets; thus, plasma damage to a substrate can be reduced. Furthermore, step coverage can be improved because the incident angle of a sputtered particle to the substrate can be made smaller depending on the inclination of the target.

Unlike in a deposition method in which particles ejected from a target or the like are deposited, in CVD and ALD, a film is formed by reaction at a surface of an object. Thus, CVD and ALD enable favorable step coverage almost regardless of the shape of an object. In particular, ALD enables excellent step coverage and excellent thickness uniformity and can be favorably used for covering a surface of an opening portion with a high aspect ratio, for example. On the other hand, ALD has a relatively low deposition rate; thus, it is sometimes preferable to combine ALD with another deposition method with a high deposition rate, such as CVD.

When CVD or ALD is used, the composition of a film to be formed can be controlled with a flow rate ratio of source gases. For example, by CVD or ALD, a film with a certain composition can be formed depending on a flow rate ratio of the source gases. Moreover, with CVD or ALD, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the film formation can be reduced because time taken for transfer and pressure adjustment is omitted. Thus, transistors or semiconductor devices can be manufactured with improved productivity.

<Substrate>

There is no significant limitation on a material used for the substrate 271. The material may be determined depending on the purpose; for example, whether it has a light-transmitting property or heat resistance that can withstand heat treatment is taken into consideration for the determination. For example, a glass substrate of barium borosilicate glass, aluminoborosilicate glass, or the like, a ceramic substrate, a quartz substrate, or a sapphire substrate can be used. Alternatively, a semiconductor substrate, a flexible substrate, an attachment film, a base film, or the like may be used as the substrate 271.

As the semiconductor substrate, a semiconductor substrate of silicon, germanium, or the like or a compound semiconductor substrate of silicon carbide, silicon germanium, gallium arsenide, indium phosphide, zinc oxide, or gallium oxide, or the like is used, for example. The semiconductor substrate may be a single-crystal semiconductor substrate or a polycrystalline semiconductor substrate.

As materials of the flexible substrate, the attachment film, the base material film, and the like, the following materials can be used, for example: polyethylene terephthalate (PET), polyethylene naphthalate (PEN), polyether sulfone (PES), polytetrafluoroethylene (PTFE), polypropylene, polyester, polyvinyl fluoride, polyvinyl chloride, polyolefin, polyamide (e.g., nylon or aramid), polyimide, polycarbonate, aramid, an epoxy resin, and an acrylic resin.

The flexible substrate used as the substrate 271 preferably has a lower coefficient of linear expansion because a lower coefficient of linear expansion suppresses deformation due to an environment. The flexible substrate used as the substrate 271 is formed using, for example, a material whose coefficient of linear expansion is lower than or equal to $1 \times 10^{-3}$/K, lower than or equal to $5 \times 10^{-5}$/K, or lower than or equal to $1 \times 10^{-5}$/K. In particular, aramid is preferably used for the flexible substrate because of its low coefficient of linear expansion.

<Insulating Layer>

The insulating layers 272, 226, 225, 228, and 229 can be formed using a single layer or a stack of layers of one or more materials selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, aluminum silicate, or the like. Alternatively, a material in which two or more materials selected from an oxide material, a nitride material, an oxynitride material, and a nitride oxide material are mixed may be used.

Note that in this specification, a nitride oxide refers to a compound that includes more nitrogen than oxygen. An oxynitride refers to a compound that includes more oxygen than nitrogen. The content of each element can be measured by Rutherford backscattering spectrometry (RBS), for example.

It is particularly preferable that the insulating layers 272 and 229 be formed using an insulating material that is relatively impermeable to impurities. The insulating layers 272 and 229 may each be formed using, for example, a single layer or a stack of layers of an insulating material containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Examples of such an insulating material that is relatively impermeable to impurities include aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, tantalum oxide, and silicon nitride. The insulating layer 272 or 229 may be formed using indium tin zinc oxide (In—Sn—Zn oxide) having an excellent insulating property, or the like.

When the insulating material that is relatively impermeable to impurities is used for the insulating layer 272, impurity diffusion from the substrate 271 side can be suppressed, and the reliability of the transistor can be improved. When the insulating material that is relatively impermeable to impurities is used for the insulating layer 229, impurity diffusion from the insulating layer 229 side can be suppressed, and the reliability of the transistor can be improved.

A plurality of insulating layers formed using such materials may be stacked to form any of the insulating layers 272, 226, 225, 228, and 229. The formation method of the insulating layers 272, 226, 225, 228, and 229 is not particularly limited, and a formation method such as sputtering, CVD, MBE, PLD, ALD, or spin coating can be used.

For example, in the case where aluminum oxide is formed by thermal CVD, two kinds of gases, e.g., $H_2O$ as an oxidizer and a source material gas which is obtained by vaporizing a solvent and liquid containing an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

When an oxide semiconductor is used for the semiconductor layer 242, the hydrogen concentration in the insulating layers is preferably lowered in order to prevent an increase in hydrogen concentration in the semiconductor layer 242. It is particularly preferable to lower the hydrogen concentration of the insulating layer in contact with the semiconductor layer 242. Specifically, the hydrogen concentration in the insulating layer that is measured by SIMS is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. Furthermore, the nitrogen concentration in the insulating layers is preferably lowered in order to prevent an increase in the nitrogen concentration in the semiconductor layer 242. It is particularly preferable to lower the nitrogen concentration of the insulating layer in contact with the semiconductor layer 242. Specifically, the nitrogen concentration in the insulating layer that is measured by SIMS is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

The concentration measured by SIMS analysis might include a variation within a range of ±40%.

When an oxide semiconductor is used for the semiconductor layer 242, the insulating layers are preferably formed using insulating layers from which oxygen is released by heating. It is particularly preferable that the insulating layer in contact with the semiconductor layer 242 be an insulating layer from which oxygen is released by heating. For example, the amount of oxygen released from the insulating layer that is converted into oxygen atoms is preferably greater than or equal to $1.0\times10^{18}$ atoms/cm$^3$, more preferably greater than or equal to $1.0\times10^{19}$ atoms/cm$^3$, still more preferably greater than or equal to $1.0\times10^{20}$ atoms/cm$^3$ in thermal desorption spectroscopy (TDS) analysis. In the TDS analysis, heat treatment is performed so that the surface temperature of the insulating layer is higher than or equal to 100° C. and lower than or equal to 700° C., preferably higher than or equal to 100° C. and lower than or equal to 500° C. Note that in this specification and the like, oxygen released by heating is also referred to as excess oxygen.

The insulating layer containing excess oxygen can be formed by performing treatment for adding oxygen to an insulating layer. The treatment for adding oxygen can be performed by heat treatment in an oxygen atmosphere or can be performed with an ion implantation apparatus, an ion doping apparatus, or a plasma treatment apparatus. As a gas for adding oxygen, an oxygen gas of $^{16}O_2$, $^{18}O_2$, or the like, a nitrous oxide gas, an ozone gas, or the like can be used. In this specification, the treatment for adding oxygen is also referred to as oxygen doping treatment.

The formation of an insulating layer by sputtering in an atmosphere including oxygen enables introduction of oxygen into the insulating layer.

In general, a capacitor has a structure in which a dielectric is sandwiched between two electrodes that face each other; as the thickness of the dielectric becomes smaller (as the distance between the two facing electrodes becomes shorter) or as the dielectric constant of the dielectric becomes higher, capacitance becomes higher. However, if the thickness of the dielectric is reduced in order to increase the capacitance of the capacitor, because of a tunnel effect or the like, current unintentionally flowing between the two electrodes (leakage current) tends to increase and the withstand voltage of the capacitor tends to be lower.

A portion where a gate electrode, a gate insulating layer, and a semiconductor layer of a transistor overlap with each other functions as a capacitor (hereinafter also referred to as a gate capacitor). A channel is formed in a region of the semiconductor layer that overlaps with the gate electrode with the gate insulating layer provided therebetween. That is, the gate electrode and a channel formation region function as two electrodes of the capacitor. Furthermore, the gate insulating layer functions as a dielectric of the capacitor. Although it is preferable that the capacitance of the gate capacitor be as high as possible, a reduction in the thickness of the gate insulating layer for increasing the capacitance increases the probability of occurrence of an increase in leakage current or a reduction in withstand voltage.

In the case where a high-k material such as hafnium silicate ($HfSi_xO_y$ (x>0, y>0)), hafnium silicate to which nitrogen is added ($HfSi_xO_yN_z$ (x>0, y>0, z>0)), hafnium aluminate to which nitrogen is added ($HfAl_xO_yN_z$ (x>0, y>0, z>0)), hafnium oxide, or yttrium oxide is used as a dielectric, even if the thickness of the dielectric is made thick, sufficient capacitance of the capacitor can be ensured.

For example, in the case where a high-k material with a high dielectric constant is used as the dielectric, even when the dielectric is made thick, a capacitance equivalent to that in the case of using silicon oxide as the dielectric can be obtained. This enables a reduction in leakage current between the two electrodes of the capacitor. The dielectric may have a layered structure of the high-k material and another insulating material.

The insulating layer 275 has a flat surface. As the insulating layer 275, an organic material having heat resistance, such as polyimide, an acrylic-based resin, a benzocyclobutene-based resin, polyamide, or an epoxy-based resin, as well as the above insulating materials can be used. Other than such organic materials, it is possible to use a low-dielectric constant material (a low-k material), a siloxane-based resin, PSG (phosphosilicate glass), BPSG (borophosphosilicate glass), or the like. Note that a plurality of insulating layers formed using these materials may be stacked to form the insulating layer 275.

Note that the siloxane-based resin corresponds to a resin including an Si—O—Si bond formed using a siloxane-based material as a starting material. The siloxane-based resin may include an organic group (e.g., an alkyl group or an aryl group) or a fluoro group as a substituent. The organic group may include a fluoro group.

There is no particular limitation on the method for forming the insulating layer 275; depending on a material thereof, any of the following methods may be used: sputtering, an SOG method, spin coating, dipping, spray coating, a droplet discharging method (e.g., an ink-jet method), a printing method (e.g., screen printing or offset printing), or the like.

The sample surface may be subjected to CMP treatment. The CMP treatment can reduce unevenness of the surface, so that coverage with an insulating layer or a conductive layer to be formed later can be increased.

<Semiconductor Layer>

A single-crystal semiconductor, a polycrystalline semiconductor, a microcrystalline semiconductor, an amorphous semiconductor, or the like can be used for the semiconductor layer 242. As a semiconductor material, silicon, germanium, or the like can be used. Alternatively, a compound semiconductor of silicon germanium, silicon carbide, gallium arsenide, an oxide semiconductor, a nitride semiconductor, or the like; an organic semiconductor; or the like can be used.

In the case of using an organic semiconductor for the semiconductor layer 242, a low molecular organic material having an aromatic ring, a π-electron conjugated conductive polymer, or the like can be used. For example, rubrene, tetracene, pentacene, perylenediimide, tetracyanoquinodimethane, polythiophene, polyacetylene, or polyparaphenylene vinylene can be used.

As described above, the band gap of an oxide semiconductor is 2 eV or wider; thus, when the oxide semiconductor is used for the semiconductor layer 242, a transistor with an extremely low off-state current can be provided. An OS transistor has high withstand voltage between its source and drain. Thus, a transistor with high reliability can be provided. Furthermore, a display device, a semiconductor device, or the like with high reliability can be provided.

In this embodiment, the case where an oxide semiconductor is used for the semiconductor layer 242 is described. For the oxide semiconductor used for the semiconductor layer 242, an oxide semiconductor containing, for example, indium (In) is preferably used. An oxide semiconductor can have a high carrier mobility (electron mobility) by containing indium, for example. An oxide semiconductor preferably contains an element M.

The element M is preferably aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, tungsten, magnesium, and the like. Note that two or more of the above elements may be used in combination as the element M. The element M has a high bonding energy with oxygen, for example. The element M increases the energy gap of the oxide semiconductor, for example. Furthermore, the oxide semiconductor preferably contains zinc. When the oxide semiconductor contains zinc, the oxide semiconductor is easily crystallized in some cases.

Note that the oxide semiconductor used for the semiconductor layer 242 is not limited to the oxide containing indium. The oxide semiconductor may be, for example, an oxide which does not contain indium and contains zinc, an oxide which does not contain indium and contains gallium, or an oxide which does not contain indium and contains tin, e.g., a zinc tin oxide, a gallium tin oxide, or gallium oxide.

For example, in the case where an $InGaZnO_X$ (X>0) film is formed as the semiconductor layer 242 by thermal CVD, trimethylindium ($In(CH_3)_3$), trimethylgallium ($Ga(CH_3)_3$), and dimethylzinc ($Zn(CH_3)_2$) are used. Without limitation to the above combination, triethylgallium ($Ga(C_2H_5)_3$) can be used instead of trimethylgallium, and diethylzinc ($Zn(C_2H_5)_2$) can be used instead of dimethylzinc.

For example, in the case where an $InGaZnO_X$ film (X>0) is formed as the semiconductor layer 242 by ALD, an $In(CH_3)_3$ gas and an $O_3$ gas are sequentially introduced more than once to form an $InO_2$ layer, subsequently a $Ga(CH_3)_3$ gas and an $O_3$ gas are sequentially introduced more than once to form a GaO layer, and then a $Zn(CH_3)_2$ gas and an $O_3$ gas are sequentially introduced more than once to form a ZnO layer. Note that the order of these layers is not limited to this example. A mixed compound layer such as an $InGaO_2$ layer, an $InZnO_2$ layer, a GaInO layer, a ZnInO layer, or a GaZnO layer may be formed by using these gases. Note that although an $H_2O$ gas which is obtained by bubbling water with an inert gas such as Ar may be used instead of an $O_3$ gas, it is preferable to use an $O_3$ gas, which does not contain H. Furthermore, instead of an $In(CH_3)_3$ gas, an $In(C_2H_5)_3$ gas or tris(acetylacetonato)indium may be used. Note that tris(acetylacetonato)indium is also referred to as $In(acac)_3$. In addition, instead of a $Ga(CH_3)_3$ gas, a $Ga(C_2H_5)_3$ gas or tris(acetylacetonato)gallium may be used. Note that tris (acetylacetonato)gallium is also referred to as $Ga(acac)_3$. Furthermore, a $Zn(CH_3)_2$ gas or zinc acetate may be used. However, the deposition gas is not limited to these.

In the case where the oxide semiconductor is formed by sputtering, a target containing indium is preferably used in order to reduce the number of particles. In addition, if an oxide target having a high atomic ratio of the element M is used, the conductivity of the target might be decreased. In the case where a target containing indium is used, the conductivity of the target can be increased and DC discharge or AC discharge is facilitated; thus, deposition over a large substrate can be easily performed. Thus, semiconductor devices can be manufactured with improved productivity.

As described above, in the case where the oxide semiconductor is formed by sputtering, the atomic ratio of In to M and Zn contained in the target may be 3:1:1, 3:1:2, 3:1:4, 1:1:0.5, 1:1:1, 1:1:2, 1:4:4, 5:1:7, or 4:2:4.1, for example.

When the oxide semiconductor is formed by sputtering, an oxide semiconductor having an atomic ratio different from the atomic ratio of the target might be formed. In particular, the atomic ratio of zinc in the deposited film is smaller than the atomic ratio in the target in some cases. Specifically, the proportion of zinc in the film is approximately 40 to 90 atomic % of that of zinc in the target in some cases.

In order to give stable electrical characteristics to the OS transistor, it is preferable that impurities and oxygen vacancies in the oxide semiconductor layer be reduced to highly purify the oxide semiconductor layer so that the semiconductor layer 242 can be regarded as a highly-purified intrinsic or substantially highly-purified intrinsic oxide semiconductor layer. Furthermore, it is preferable that at least the channel formation region in the semiconductor layer 242 can be regarded as a highly-purified intrinsic or substantially highly-purified intrinsic oxide semiconductor layer.

When an oxide semiconductor is used for the semiconductor layer 242, a c-axis aligned crystalline oxide semiconductor (CAAC-OS) is preferably used. The CAAC-OS is an oxide semiconductor having a plurality of c-axis aligned crystal parts.

In the oxide semiconductor layer used as the semiconductor layer 242, a region where CAAC is not formed preferably accounts for less than 20% of the whole oxide semiconductor layer.

The CAAC-OS has dielectric anisotropy. Specifically, the CAAC-OS has a higher dielectric constant in the c-axis direction than in the a-axis direction and the b-axis direction. In a transistor in which a CAAC-OS is used for a semiconductor layer where a channel is formed and a gate electrode is positioned in the c-axis direction, the dielectric constant in the c-axis direction is high; thus, an electric field generated from the gate electrode easily reaches the entire CAAC-OS. The subthreshold swing value (S value) can be made small. In addition, in the transistor in which a CAAC-OS is used for the semiconductor layer, an increase in the S value due to miniaturization is less likely to occur.

Moreover, since the dielectric constant in the a-axis direction and the b-axis direction of an CAAC-OS is low, the influence of an electric field generated between a source and a drain is reduced. Thus, a channel length modulation effect, a short-channel effect, or the like is less likely to occur, and the reliability of the transistor can be increased.

Here, the channel length modulation effect is a phenomenon in which, when the drain voltage is higher than the threshold voltage, a depletion layer expands from the drain side, so that the effective channel length is decreased. The short-channel effect is a phenomenon in which a short channel length leads to deterioration in electrical characteristics, such as a decrease in threshold voltage. The more a transistor is miniaturized, the more deterioration in electrical characteristics caused by the phenomena is likely to occur.

Note that after the oxide semiconductor layer is formed, oxygen doping treatment may be performed. In order to further decrease impurities such as water or hydrogen in the oxide semiconductor layer to highly purify the oxide semiconductor layer, heat treatment is preferably performed.

For example, the oxide semiconductor layer is subjected to heat treatment in a reduced-pressure atmosphere, an inert gas atmosphere of nitrogen, a rare gas, or the like, an oxidizing atmosphere, or ultra-dry air (the moisture amount is 20 ppm (−55° C. by conversion into a dew point) or less, preferably 1 ppm or less, more preferably 10 ppb or less, in the case where measurement is performed by a dew point meter in a cavity ring down laser spectroscopy (CRDS) system). Note that the oxidizing atmosphere refers to an atmosphere including an oxidizing gas such as oxygen, ozone, or nitrogen oxide at 10 ppm or more. The inert gas atmosphere refers to an atmosphere including the oxidizing gas at less than 10 ppm and being filled with nitrogen or a rare gas.

By the heat treatment, at the same time as the release of the impurities, oxygen contained in the insulating layer 226 is diffused into the oxide semiconductor layer and oxygen vacancies in the oxide semiconductor layer can be reduced. Note that the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate for desorbed oxygen. The heat treatment may be performed at any time after the oxide semiconductor layer is formed.

There is no particular limitation on a heat treatment apparatus used for the heat treatment, and the apparatus may be an apparatus that heats an object to be processed by heat conduction or heat radiation from a heating element such as a resistance heating element. For example, an electric furnace, or a rapid thermal annealing (RTA) apparatus such as a lamp rapid thermal annealing (LRTA) apparatus or a gas rapid thermal annealing (GRTA) apparatus can be used. The LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for heat treatment using a high-temperature gas.

The heat treatment is performed at a temperature higher than or equal to 250° C. and lower than or equal to 650° C., preferably higher than or equal to 300° C. and lower than or equal to 500° C. The treatment time is shorter than or equal to 24 hours. Heat treatment for over 24 hours is not preferable because productivity is reduced.

<Electrode>

As a conductive material for forming the electrodes 246, 223, 244a, 244b, 287, 297, 289a, 289b, 292a, and 292b, a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, or the like can be used. Alternatively, a semiconductor having a high electric conductivity typified by polycrystalline silicon including an impurity element such as phosphorus, or silicide such as nickel silicide may be used. A plurality of stacked conductive layers formed using these materials may be used as the electrode.

The conductive material for forming the electrodes 246, 223, 244a, 244b, 287, 297, 289a, 289b, 292a, and 292b can also be formed using a conductive material containing oxygen, such as indium tin oxide (ITO), indium oxide containing tungsten oxide, indium zinc oxide containing tungsten oxide, indium oxide containing titanium oxide, indium tin oxide containing titanium oxide, indium zinc oxide, indium gallium zinc oxide, or indium tin oxide to which silicon is added, or a conductive material containing nitrogen, such as titanium nitride or tantalum nitride. It is also possible to use a layered structure formed using a material containing the above metal element and a conductive material containing oxygen. It is also possible to use a layered structure formed using a material containing the above metal element and a conductive material containing nitrogen. It is also possible to use a layered structure formed using a material containing the above metal element, a conductive material containing oxygen, and a conductive material containing nitrogen. There is no particular limitation on the formation method of the conductive material, and any of a variety of formation methods such as an evaporation method, a CVD method, a sputtering method, and a spin coating method can be employed.

<Contact Plug>

A conductive material with high embeddability, such as tungsten or polysilicon, can be used for the contact plugs 288a, 288b, 288c, 298a, and 298b, for example. A side surface and a bottom surface of the material may be covered with a barrier layer (a diffusion prevention layer) of a titanium layer, a titanium nitride layer, or a stacked layer of these layers. In that case, the barrier layer is regarded as part of the contact plug in some cases.

According to one embodiment of the present invention, a transistor with favorable electrical characteristics can be provided. Furthermore, according to one embodiment of the present invention, a highly integrated semiconductor device can be provided.

This embodiment can be combined with any of the structures described in the other embodiments as appropriate.

(Embodiment 3)

In this embodiment, examples in which the semiconductor device described in the above embodiment is used in an electronic component and examples of an electronic device including the electronic component are described with reference to FIGS. 21A and 21B and FIGS. 22A and 22B. Note that the electronic component is also referred to as a semiconductor package or an IC package. The electronic component has a plurality of standards and names depending on a terminal extraction direction and a terminal shape. Thus, examples of the electronic component are described in this embodiment.

The electronic component is completed when the semiconductor device described in any of the above embodiments is combined with components other than the semiconductor device in an assembly process (post-process).

Figure 21A:
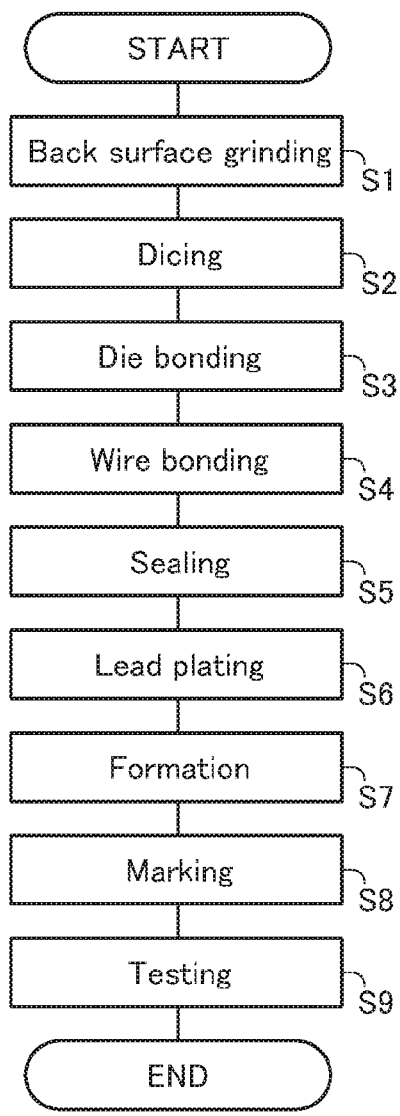
FIG. 21A is a flowchart showing a manufacturing process example of an electronic component.

The post-process is described with reference to a flow chart in FIG. 21A. After an element substrate including the semiconductor device described in any of the above embodiments is completed in a pre-process, a back surface grinding step in which a back surface (a surface where a semiconductor device and the like are not formed) of the element substrate is ground is performed (Step S1). When the element substrate is thinned by grinding, warpage or the like of the element substrate is reduced, so that the size of the electronic component can be reduced.

Next, the element substrate is divided into a plurality of chips in a dicing step (Step S2). Then, the divided chips are separately picked up to be bonded to a lead frame in a die bonding step (Step S3). To bond a chip and a lead frame in the die bonding step, a method such as resin bonding or tape-automated bonding is selected as appropriate depending on products. Note that the chip may be bonded to an interposer instead of the lead frame.

Next, a wire bonding step for electrically connecting a lead of the lead frame and an electrode on the chip through a metal wire is performed (Step S4). As the metal wire, a silver wire or a gold wire can be used. Ball bonding or wedge bonding can be used as the wire bonding.

The wire-bonded chip is subjected to a molding step of sealing the chip with an epoxy resin or the like (Step S5). Through the molding step, the inside of the electronic component is filled with a resin, so that a circuit portion incorporated in the chip and wire for connecting the chip to the lead can be protected from external mechanical force, and deterioration of characteristics (decrease in reliability) due to moisture or dust can be reduced.

Subsequently, the lead of the lead frame is plated in a lead plating step (Step S6). This plating process prevents rust of the lead and facilitates soldering at the time of mounting the chip on a printed wiring board in a later step. Then, the lead is cut and processed in a formation step (Step S7).

Next, a printing (marking) step is performed on a surface of the package (Step S8). After a testing step (Step S9) for checking whether an external shape is good and whether there is malfunction, for example, the electronic component is completed.

The above electronic component can include the transistor described in any of the above embodiments. Thus, the electronic component including the semiconductor device in which the frequency of malfunction in a high-temperature environment is reduced and manufacturing cost is reduced can be obtained. Since the electronic component includes the semiconductor device in which the frequency of malfunction in a high-temperature environment is reduced and manufacturing cost is reduced, limit of the electronic component on a usage environment is relieved and the size of the electronic component is reduced.

Figure 21B:
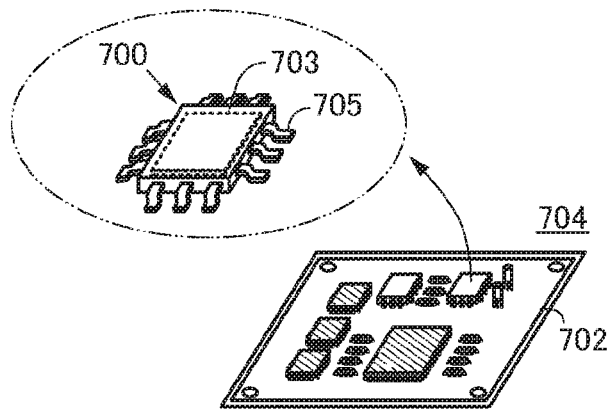
FIG. 21B is a schematic perspective view of the electronic component.

FIG. 21B is a perspective schematic diagram of a completed electronic component. FIG. 21B is a perspective schematic diagram illustrating a quad flat package (QFP) as an example of the electronic component. An electronic component 700 in FIG. 21B includes a lead 705 and a semiconductor device 703. As the semiconductor device 703, the semiconductor device described in any of the above embodiments can be used.

The electronic component 700 in FIG. 21B is mounted on a printed circuit board 702, for example. A plurality of electronic components 700 that are combined and electrically connected to each other over the printed circuit board 702; thus, a circuit board on which the electronic components are mounted (a circuit board 704) is completed. The completed circuit board 704 is provided in an electronic device or the like.

Next, application examples of the electronic components that are applied to a driver circuit for driving an inverter, a motor, or the like, which is provided in a vehicle driven with power from a fixed power source (e.g., a bicycle), are described with reference to FIGS. 22A and 22B.

Figure 22A:
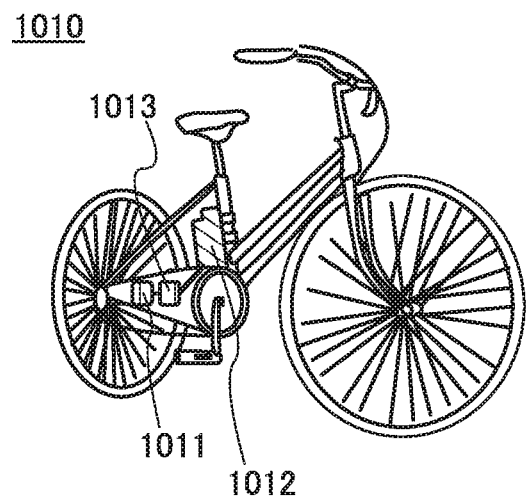
FIGS. 22A and 22B each illustrate an example of an electronic device.

FIG. 22A illustrates an electric bicycle 1010 as an application example. The electric bicycle 1010 obtains power when current flows through a motor 1011. The electric bicycle 1010 includes a storage battery 1012 for supplying current to the motor 1011 and a driver circuit 1013 for driving the motor. Note that although a pedal is illustrated in FIG. 22A, the pedal is not necessarily provided.

A circuit board provided with an electronic component including the semiconductor device described in any of the above embodiments is incorporated in the driver circuit 1013. Thus, an electric bicycle including a smaller electronic component can be obtained. In addition, a low-power electric bicycle with a long cruising distance can be obtained. Moreover, a highly reliable electric bicycle can be obtained.

Figure 22B:
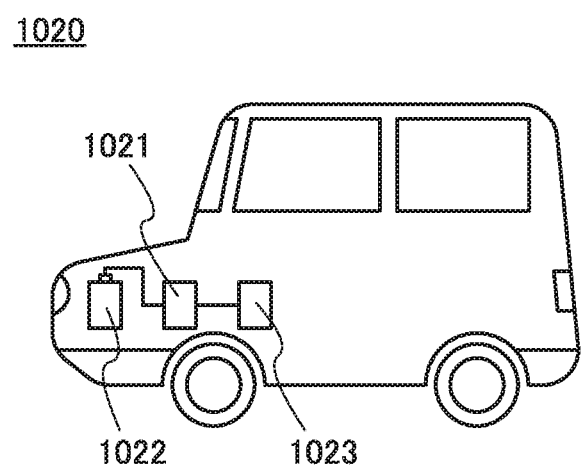

FIG. 22B illustrates an electric car 1020 as another application example. The electric car 1020 obtains power when current flows through a motor 1021. The electric car 1020 includes a storage battery 1022 for supplying current to the motor 1021 and a driver circuit 1023 for driving the motor.

A circuit board provided with an electronic component including the semiconductor device described in any of the above embodiments is incorporated in the driver circuit 1023. Thus, an electric car including a smaller electronic component can be obtained. In addition, a low-power electric car with a long cruising distance can be obtained. Moreover, a highly reliable electric car can be obtained.

An electronic component including the semiconductor device described in any of the above embodiments is applicable not only to electric vehicles (EV) but also to hybrid electric vehicles (HEV), plug-in hybrid electric vehicles (PHEV), and the like.

As described above, a circuit broad provided with an electronic component including the semiconductor device described in any of the above embodiments is incorporated in each of the electronic devices described in this embodiment. Thus, an electronic device including a smaller electronic component can be obtained. In addition, a low-power electronic device can be obtained. Moreover, a highly reliable electronic device can be obtained.

This embodiment can be combined with any of the structures described in the other embodiments as appropriate.

(Embodiment 4)

The semiconductor device in one embodiment of the present invention can be used for control circuits in a variety of electronic devices. FIG. 23 illustrates specific examples of the electronic device including the semiconductor device in one embodiment of the present invention.

Examples of the electronic device including the semiconductor device in one embodiment of the present invention are as follows: display devices of televisions, monitors, and the like; lighting devices; desktop personal computers and laptop personal computers; word processors; image reproduction devices which reproduce still images and moving images stored in recording media such as digital versatile discs (DVD); portable CD players; portable radios; tape recorders; headphone stereos; stereos; table clocks; wall clocks; cordless phone handsets; transceivers; mobile phones; car phones; portable game machines; tablet terminals; large-sized game machines such as pachinko machines; calculators; portable information terminals; electronic notebooks; e-book readers; electronic translators; audio input devices; video cameras; digital still cameras; electric shavers; high-frequency heating appliances such as microwave ovens; electric rice cookers; electric washing machines; electric vacuum cleaners; water heaters; electric fans; hair dryers; air-conditioning systems such as air conditioners, humidifiers, and dehumidifiers; dishwashers; dish dryers; clothes dryers; futon dryers; electric refrigerators; electric freezers; electric refrigerator-freezers; freezers for preserving DNA; flashlights; tools such as a chain saw; smoke detectors; and medical equipment such as dialyzers. Other examples are as follows: industrial equipment such as guide lights, traffic lights, conveyor belts, elevators, escalators, industrial robots, power storage systems, and power storage devices for leveling the amount of power supply and smart grid.

In addition, moving objects driven by electric motors using power from a power storage device are also included in the category of electronic devices. Examples of the moving objects are electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircrafts, rockets, artificial satellites, space probes, planetary probes, and spacecrafts.

FIG. 23 illustrates examples of electronic devices. In FIG. 23, a display device 8000 is an example of an electronic device including a semiconductor device 8004 in one embodiment of the present invention. Specifically, the display device 8000 corresponds to a display device for TV broadcast reception and includes a housing 8001, a display portion 8002, speaker portions 8003, the semiconductor device 8004, a power storage device 8005, and the like. The semiconductor device 8004 in one embodiment of the present invention is provided in the housing 8001. The semiconductor device 8004 can control driving of a cooling fan in the display device 8000, emission luminance adjustment, and the like. The display device 8000 can receive power from a commercial power source. Alternatively, the display device 8000 can use power stored in the power storage device 8005.

A display device such as a liquid crystal display device, a light-emitting device in which a light-emitting element such as an organic EL element is provided in each pixel, an electrophoretic display device, a digital micromirror device (DMD), a plasma display panel (PDP), or a field emission display (FED) can be used for the display portion 8002.

Note that the display device includes, in its category, all of information display devices for personal computers, advertisement displays, and the like, in addition to TV broadcast reception.

In FIG. 23, an installation lighting device 8100 is an example of an electronic device including a semiconductor device 8103 in one embodiment of the present invention. Specifically, the lighting device 8100 includes a housing 8101, a light source 8102, the semiconductor device 8103, a power storage device 8105, and the like. Although FIG. 23 illustrates the case where the semiconductor device 8103 is provided in a ceiling 8104 on which the housing 8101 and the light source 8102 are installed, the semiconductor device 8103 may be provided in the housing 8101. The semiconductor device 8103 can control emission luminance or the like of the light source 8102. The lighting device 8100 can also receive power from a commercial power source. Alternatively, the lighting device 8100 can use power stored in the power storage device.

Although FIG. 23 illustrates the installation lighting device 8100 provided in the ceiling 8104, the semiconductor device in one embodiment of the present invention can be used in an installation lighting device provided in, for example, a wall 8405, a floor 8406, or a window 8407 other than the ceiling 8104. Alternatively, the semiconductor device in one embodiment of the present invention can be used in a tabletop lighting device or the like.

As the light source 8102, an artificial light source which emits light artificially by using power can be used. Specifically, an incandescent lamp, a discharge lamp such as a fluorescent lamp, and light-emitting elements such as an LED and an organic EL element are given as examples of the artificial light source.

In FIG. 23, an air conditioner including an indoor unit 8200 and an outdoor unit 8204 is an example of an electronic device including a semiconductor device 8203 in one embodiment of the present invention. Specifically, the indoor unit 8200 includes a housing 8201, an air outlet 8202, the semiconductor device 8203, a power storage device 8205, and the like. Although FIG. 23 illustrates the case where the semiconductor device 8203 is provided in the indoor unit 8200, the semiconductor device 8203 may be provided in the outdoor unit 8204. Alternatively, the semiconductor devices 8203 may be provided in both the indoor unit 8200 and the outdoor unit 8204. The semiconductor device 8203 can control operation of a motor used for a compressor in the air conditioner. The air conditioner can receive power from a commercial power source. Alternatively, the air conditioner can use power stored in the power storage device 8205.

Note that although the split-type air conditioner including the indoor unit and the outdoor unit is illustrated in FIG. 23, the semiconductor device in one embodiment of the present invention can be used in an air conditioner in which the functions of an indoor unit and an outdoor unit are integrated in one housing.

In FIG. 23, an electric refrigerator-freezer 8300 is an example of an electronic device including a semiconductor device 8304 in one embodiment of the present invention. Specifically, the electric refrigerator-freezer 8300 includes a housing 8301, a refrigerator door 8302, a freezer door 8303, the semiconductor device 8304, a power storage device 8305, and the like. The semiconductor device 8304 provided in the housing 8301 in FIG. 23 can control operation of a motor used for a compressor in the electric refrigerator-freezer 8300. The electric refrigerator-freezer 8300 can receive power from a commercial power source. Alternatively, the electric refrigerator-freezer 8300 can use power stored in the power storage device 8305.

Note that among the electronic devices described above, a high-frequency heating appliance such as a microwave oven and an electronic device such as an electric rice cooker require high power in a short time. In addition, it is necessary to stable control high power for a certain period of time. With the use of a semiconductor device in one embodiment of the present invention, a highly reliable electronic device can be obtained.

This embodiment can be combined with any of the other embodiments as appropriate.

This application is based on Japanese Patent Application serial No. 2015-163532 filed with Japan Patent Office on Aug. 21, 2015, the entire contents of which are hereby incorporated by reference.

What is claimed is:

1. A semiconductor device comprising:
a first transistor comprising a first gate and a second gate;
a second transistor;
a third transistor; and
a capacitor,
wherein one of a source and a drain of the first transistor is electrically connected to a first wiring,
wherein the other of the source and the drain of the first transistor is electrically connected to one of a source and a drain of the second transistor,
wherein the first gate of the first transistor is electrically connected to the other of the source and the drain of the first transistor,
wherein the other of the source and the drain of the second transistor is electrically connected to a second wiring,
wherein a first gate of the third transistor is electrically connected to a third wiring,
wherein one of a source and a drain of the third transistor is electrically connected to the second gate of the first transistor and one electrode of the capacitor, and
wherein the other electrode of the capacitor is electrically connected to the other of the source and the drain of the first transistor.

2. The semiconductor device according to claim 1, further comprising:
a fourth wiring capable of supplying a potential;
a fifth wiring capable of supplying a potential; and
a sixth wiring capable of outputting a signal,
wherein the fourth wiring is electrically connected to a first gate of the second transistor,
wherein the fifth wiring is electrically connected to the other of the source and the drain of the third transistor, and
wherein the sixth wiring is electrically connected to the other of the source and the drain of the first transistor.

3. The semiconductor device according to claim 1, further comprising:
a seventh wiring electrically connected to a second gate of the third transistor,
wherein a second gate of the second transistor is electrically connected to the other of the source and the drain of the second transistor.

4. The semiconductor device according to claim 1,
wherein the first to third transistors each include a metal oxide in a semiconductor layer where a channel is formed.

5. The semiconductor device according to claim 1,
wherein a channel length of the second transistor is shorter than a channel length of the first transistor.

6. The semiconductor device according to claim 1,
wherein a channel width of the second transistor is longer than a channel width of the first transistor.

7. An electronic device comprising:
a semiconductor device according to claim 1, and
a motor, a power storage device, a high-frequency heating device, or a speaker.

8. A semiconductor device comprising:
a first transistor;
a second transistor;
a third transistor; and
a capacitor,
wherein each of the first transistor, the second transistor, and the third transistor comprises a first gate and a second gate,
wherein one of a source and a drain of the first transistor is electrically connected to a first wiring,
wherein the other of the source and the drain of the first transistor is electrically connected to one of a source and a drain of the second transistor,
wherein the first gate of the first transistor is electrically connected to the other of the source and the drain of the first transistor,
wherein the other of the source and the drain of the second transistor is electrically connected to a second wiring,
wherein the first gate of the second transistor is electrically connected to the second gate of the second transistor,
wherein the first gate of the third transistor is electrically connected to a third wiring,
wherein the second gate of the third transistor is electrically connected to the third wiring,
wherein one of a source and a drain of the third transistor is electrically connected to the second gate of the first transistor and one electrode of the capacitor, and wherein the other electrode of the capacitor is electrically connected to the other of the source and the drain of the first transistor.

9. The semiconductor device according to claim 8, further comprising:
a fourth wiring capable of supplying a potential;
a fifth wiring capable of supplying a potential; and
a sixth wiring capable of outputting a signal,
wherein the fourth wiring is electrically connected to the first gate of the second transistor,
wherein the fifth wiring is electrically connected to the other of the source and the drain of the third transistor, and
wherein the sixth wiring is electrically connected to the other of the source and the drain of the first transistor.

10. The semiconductor device according to claim 8, wherein the first to third transistors each include a metal oxide in a semiconductor layer where a channel is formed.

11. The semiconductor device according to claim 8, wherein a channel length of the second transistor is shorter than a channel length of the first transistor.

12. The semiconductor device according to claim 8, wherein a channel width of the second transistor is longer than a channel width of the first transistor.

13. An electronic device comprising:
a semiconductor device according to claim 8, and
a motor, a power storage device, a high-frequency heating device, or a speaker.

14. A semiconductor device comprising:
a first transistor;
a second transistor;
a third transistor; and
a capacitor,
wherein each of the first transistor, the second transistor, and the third transistor comprises a first gate and a second gate,
wherein one of a source and a drain of the first transistor is electrically connected to a first wiring,
wherein the other of the source and the drain of the first transistor is electrically connected to one of a source and a drain of the second transistor,
wherein the first gate of the first transistor is electrically connected to the other of the source and the drain of the first transistor,
wherein the other of the source and the drain of the second transistor is electrically connected to a second wiring,
wherein the first gate of the second transistor is electrically connected to the second gate of the second transistor,
wherein the first gate of the third transistor is electrically connected to the first wiring,
wherein the second gate of the third transistor is electrically connected to the first wiring,
wherein one of a source and a drain of the third transistor is electrically connected to the second gate of the first transistor and one electrode of the capacitor, and
wherein the other electrode of the capacitor is electrically connected to the other of the source and the drain of the first transistor.

15. The semiconductor device according to claim 14, further comprising:
a third wiring capable of supplying a potential;
a fourth wiring capable of supplying a potential; and
a fifth wiring capable of outputting a signal,
wherein the third wiring is electrically connected to the first gate of the second transistor,
wherein the fourth wiring is electrically connected to the other of the source and the drain of the third transistor, and
wherein the fifth wiring is electrically connected to the other of the source and the drain of the first transistor.

16. The semiconductor device according to claim 14, wherein the first to third transistors each include a metal oxide in a semiconductor layer where a channel is formed.

17. The semiconductor device according to claim 14, wherein a channel length of the second transistor is shorter than a channel length of the first transistor.

18. The semiconductor device according to claim 14, wherein a channel width of the second transistor is longer than a channel width of the first transistor.

19. An electronic device comprising:
a semiconductor device according to claim 14, and
a motor, a power storage device, a high-frequency heating device, or a speaker.

* * * * *